(12) United States Patent
Myers et al.

US011209488B2

(10) Patent No.: US 11,209,488 B2
(45) Date of Patent: Dec. 28, 2021

(54) ENERGY DELIVERY SYSTEM

(71) Applicant: LiTech Laboratories, LLC, Austin, TX (US)

(72) Inventors: Robert L. Myers, Austin, TX (US); Alexei Tikhonski, Austin, TX (US); James P. Novak, Austin, TX (US)

(73) Assignee: Litech Laboratories, Inc., Austin, TX (US)

( * ) Notice: Subject to any disclaimer, the term of this patent is extended or adjusted under 35 U.S.C. 154(b) by 0 days.

(21) Appl. No.: 16/985,025

(22) Filed: Aug. 4, 2020

(65) Prior Publication Data
US 2020/0379051 A1 Dec. 3, 2020

Related U.S. Application Data

(63) Continuation-in-part of application No. 16/760,762, filed as application No. PCT/US2017/068301 on Dec. 22, 2017.
(Continued)

(51) Int. Cl.
*G01R 31/36* (2020.01)
*H02J 7/00* (2006.01)
*G01R 31/3842* (2019.01)

(52) U.S. Cl.
CPC ..... *G01R 31/3648* (2013.01); *G01R 31/3842* (2019.01); *H02J 7/0029* (2013.01); *H02J 7/0063* (2013.01)

(58) Field of Classification Search
CPC ........ H02J 7/342; H02J 7/0029; H02J 7/0063; H02J 7/0024; Y02T 10/70; G01R 31/3842; G01R 31/3648
See application file for complete search history.

(56) References Cited

U.S. PATENT DOCUMENTS 5,187,454 A * 2/1993 Collins ................. H03H 11/30
333/17.3
5,598,041 A 1/1997 Willis
(Continued)

FOREIGN PATENT DOCUMENTS

CN 101022180 A 8/2007
CN 1864329 B 7/2011
(Continued)

OTHER PUBLICATIONS

Rao, "Battery Modeling for Energy-Aware System Design," Computer, vol. 36, No. 12, pp. 77-87, Dec. 2003; 11 pages.
(Continued)

*Primary Examiner* — Jared Fureman
*Assistant Examiner* — Duc M Pham
(74) *Attorney, Agent, or Firm* — Kelly Kordzik; Jerry Keys; Matheson Keys & Kordzik PLLC

(57) ABSTRACT

An energy delivery system that combines multiple energy storage sources/systems of different chemical compositions or physical construction with a common control system that is configured to output energy from the system as a function of the different performance characteristics of each system, and is therefore capable of optimizing various operational characteristics of the combined system. The control system is configured to utilize a separate variable impedance network for each energy storage system to adjust the relative output current or discharge rate of each energy storage system, such as to optimize cycle life, depth of discharge, temperature, delivered power, and/or perceived safety of each energy storage system.

20 Claims, 24 Drawing Sheets

Related U.S. Application Data

(60) Provisional application No. 62/882,817, filed on Aug. 5, 2019.

(56) References Cited

U.S. PATENT DOCUMENTS

| | | | |
|---|---|---|---|
| 5,764,032 | A | 6/1998 | Moore |
| 6,400,123 | B1 | 6/2002 | Bean et al. |
| 7,038,522 | B2 | 5/2006 | Fauh |
| 7,893,560 | B2 | 2/2011 | Carter |
| 8,044,639 | B2 | 10/2011 | Tamegai |
| 9,490,662 | B2 | 11/2016 | Shinohara |
| 10,658,840 | B2 | 5/2020 | Humphrey |
| 2010/0194340 | A1 | 8/2010 | Lim |
| 2012/0007489 | A1 | 1/2012 | Kurono et al. |
| 2016/0260943 | A1 | 9/2016 | Tamburrino |
| 2017/0222466 | A1 * | 8/2017 | Sankar .................. H02J 7/0029 |

FOREIGN PATENT DOCUMENTS

| | | | |
|---|---|---|---|
| CN | 106786492 A | | 5/2017 |
| EP | 2216872 A2 | | 11/2010 |
| JP | 2000-092733 A | | 3/2000 |
| JP | 2007-240523 A | | 9/2007 |
| JP | 2010-1883829 A | | 8/2010 |
| JP | 2010-255857 A | | 9/2010 |
| JP | 2010213445 A | | 9/2010 |
| JP | 2016121931 A | | 7/2016 |
| KR | 10-2010-0133993 | | 12/2010 |
| KR | 101008755 B1 | | 1/2011 |
| KR | 10-2016-0035546 | | 3/2016 |
| RU | 2487392 C2 | | 7/2013 |
| WO | 2009131941 A1 | | 10/2009 |
| WO | WO-2009131941 A1 * | 10/2009 | ................ H02J 7/34 |
| WO | 2012/0000125963 A2 | | 9/2012 |
| WO | 2016/085460 A1 | | 6/2016 |

OTHER PUBLICATIONS

Russian International Searching Authority; International Search Report & Written Opinion for PCT/US2017/068301; dated Aug. 23, 2008; 6 pages; Moscow; RU.

Texas Instruments; User's Guide; bq76200 High Voltage Battery Pack Front-End Charge/Discharge High-Side NFET Driver Evaluation Module; 21 pages; Jul. 2015.

Texas Instruments; Product Preview bq76200 High Voltage Battery Pack Front-End Charge/Discharge High-Side NFET Driver; 22 pages; Sep. 2015.

Japanese Patent Office; Office Action issued for corresponding JP Application No. 2019-536291; dated Apr. 12, 2021; 4 pages; Tokyo, JP.

Federal Institute of Industrial Property; International Search Report & Written Opinion for PCT/2020/044898; 6 pages; Moscow; RU.

* cited by examiner

ENERGY DELIVERY SYSTEM

This application is a continuation-in-part application of U.S. patent application Ser. No. 16/760,762, filed Apr. 30, 2020, which is a national phase application of International application no. PCT/US2017/068301, filed Dec. 22, 2017, which are both hereby incorporated by reference herein. This application also claims priority to U.S. provisional patent application Ser. No. 62/882,817, filed Aug. 5, 2019, which is hereby incorporated by reference herein.

TECHNICAL FIELD

The present invention relates in general to energy sources for electronic devices, and in particular, to a system for delivering energy from an energy storage system or source.

BACKGROUND INFORMATION

This section is intended to introduce various aspects of the art, which may be associated with exemplary embodiments of the present disclosure. This discussion is believed to assist in providing a framework to facilitate a better understanding of particular aspects of the present disclosure. Accordingly, it should be understood that this section should be read in this light, and not necessarily as admissions of prior art.

More than ever, there is a reliance on energy devices that can provide electrical power to enable technological conveniences. Primarily, the electrical power comes from a network grid that operates continuously. However, there is need for electrical power to be supplied from non-grid sources due to remote locations or interruptions where the power grid is unavailable. Energy can be extracted from non-grid devices and systems using these sources that include chemical energy storage, potential energy storage, or kinetic energy storage, and delivered or converted to be compatible with the existing electrical grid framework and complete electrical work. Examples of chemical energy storage systems include, but are not limited to, lithium batteries, nickel batteries, flow cell batteries, and lead acid batteries. Examples of potential energy storage systems include, but are not limited to, parametric devices, such as lithium capacitors, supercapacitors, and Electric Double-Layer Capacitors ("ELDCs"). Examples of kinetic energy storage systems include, but are not limited to, rotating mass systems, such as flywheels and other mechanical devices that are coupled through a mechanical-electrical conversion process. Throughout this disclosure, these terms may be interchangeably used in relation to energy delivery devices that can each deliver electrical energy to apply a voltage, supply a current, and/or do work.

The performance characteristics of a battery, capacitor, or other energy storage system are generally determined by the construction of the device, and in the case of electrochemical storage devices, their chemical compositions. Such characteristics include, but are not limited to, volumetric energy density (Watt-hours per unit volume), gravimetric energy density (Watt-hours per unit mass), power density (i.e., the rate at which energy can be extracted from the device), charge/discharge cycle life, operating temperature range, electrode voltage(s), and overall stability against aging. Moreover, in the case of batteries, some chemical compositions are more stable during fault conditions, and therefore yield a battery that is more resistant to thermal runaway, and thus is considered to be "safer" than other chemical formulations. For example, lithium ion batteries are among the most commonly used electrochemical energy storage devices. Additionally, due do to varying market prices for certain raw materials, there can be significant price differences between battery cells of different compositions when examined on a unit price per Watt-hour of stored energy.

Battery cells (also referred to herein as "energy cells") are typically coupled in series and/or parallel combinations to form a battery cell stack (also referred to herein as a "cell stack" or "battery stack"), and when combined with an appropriate control system form the basis of modern battery-based energy storage/delivery systems. However, there has not yet been provided, and thus there is a need for an energy delivery system that can safely combine multiple energy storage sources or systems that are different from each other (e.g., containing battery cells based on more than one chemical composition). Such an energy storage/delivery system could have not only electrical performance advantages, but also cost, safety, and/or life advantages. For example, by carefully combining cells of different chemical compositions, an energy storage system can be made up of cells chemically optimized for price, safety, and/or extended calendar and cycle life, and another energy storage system can be made up of cells optimized for some different but otherwise important parameter.

DETAILED DESCRIPTION

Figure 1:
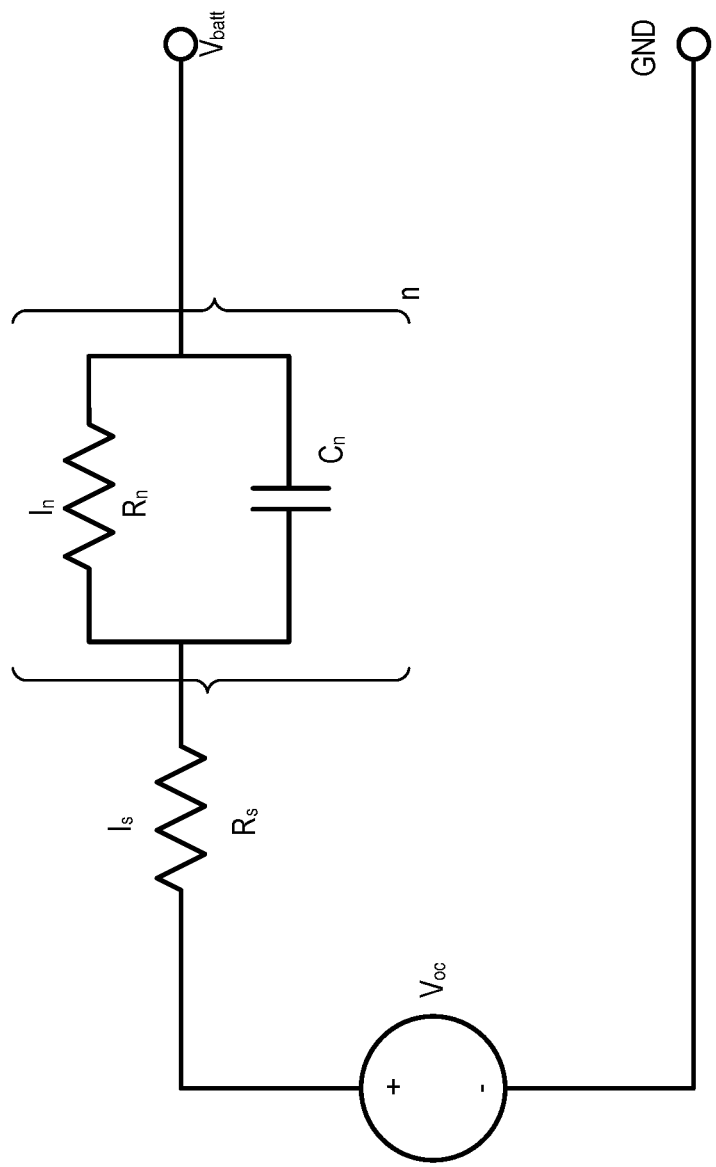
FIG. 1 illustrates a schematic diagram of a model for a battery cell.

It will be understood that particular embodiments described herein are shown by way of illustration and not as limitations of embodiments of the invention. The principal features of this invention can be employed in various embodiments without departing from the scope of the invention.

Embodiments of the present disclosure are described with respect to electrochemical storage systems (e.g., battery technologies) due to their improved energy density and higher deployed application and usage compared to other types of energy storage and mechanical devices. However, embodiments of the present disclosure are not limited to the utilization of battery cells for energy storage systems; the various embodiments of the present disclosure described herein are applicable to the utilization of any type of energy storage system, including, but not limited to, potential energy and kinetic energy storage systems, such as those disclosed herein.

Embodiments of the present disclosure provide an energy delivery system that combines multiple energy storage sources/systems of different chemical compositions or physical construction with a common control system that is configured to deliver energy from the system as a function of the different performance characteristics of each system, and is therefore capable of optimizing various operational characteristics of the combined system. In accordance with certain embodiments of the present disclosure, an energy delivery system is provided that combines two or more battery or other energy storage systems that are coupled in parallel and coupled to a common load. Each of the coupled energy storage systems contains battery cells of distinctly different chemical compositions, constructions, or methods of operation. In accordance with embodiments of the present disclosure, a control system is configured to utilize a separate variable impedance network for each energy storage system to adjust the relative output current or discharge rate of each energy storage system, such as to optimize cycle life, depth of discharge, temperature, delivered power, and/or perceived safety of each energy storage system. For example, in accordance with embodiments of the present disclosure, the energy delivery system may contain two or more battery cell stacks, each with different battery chemical compositions. Such a multi-chemistry system may contain two or more individual groups of series/parallel connected cells to form two or more battery stacks under the control of a common control system to provide an energy delivery system. In such a non-limiting example, each battery stack may have unique and different performance characteristics determined by the chemical compositions of the cells within it. The two or more separate battery stacks may be coupled in parallel to create a battery system that will deliver output power to a coupled load. In accordance with certain embodiments of the present disclosure, the series cell count of each battery stack may be predetermined such that the total stack voltages of each stack are optimally matched. In accordance with certain embodiments of the present disclosure, the parallel cell count of each battery stack may be predetermined to optimize the capacity in Watt-hours of each battery stack as required by the end use application.

Lithium ion battery cells can generally be divided into two classes related to energy capability or power capability. Lithium ion "energy cells" are described as having maximized volumetric or gravimetric energy density, and have an internal chemical composition that maximizes lithium ion storage, but have high an internal impedance that limits their ability to deliver high currents above 3C (where "C" refers to the battery capacity). Such energy cells are utilized in applications such as notebook computers and cell phones where energy is extracted slowly over a period of hours or days. Lithium ion "power cells" are described as having maximized current delivery capability, and have an internal chemical composition that minimizes internal impedance to allow unimpeded mass transport of lithium ions, and thus allow very high pulse or continuous currents to be delivered without reduction of the cell terminal voltage to its cutoff limits. Power cells may have a discharge rate greater than 8C and up to 50C. Power cells typically have thicker current collectors as compared to energy cells. These internal construction and chemical differences result in lower energy storage capacity and cycle life capability compared to energy cells. Power cells are typically used in applications such as cordless drills and other tools where high amounts of energy must be delivered over a short time period, and all of the stored energy is extracted over discharge times such as one hour or less. Within each cell classification (power or energy) there may be a wide range of cell part numbers with varying energy densities and varying internal resistance values.

Lithium ion batteries are available in a wide range of chemical compositions and construction techniques, each with specific relative advantages and disadvantages in performance related to cycle life, cost, safety, and energy density as listed in the following table:

| Chemical Composition | Relative Cost | Typical Cycle Life (cycles) | Relative Energy Density | Relative Power Capability | Relative Safety |
|---|---|---|---|---|---|
| Cobalt Oxide | Low | 1500 | High | Moderate | Low |
| NMC | Low | 1000 | Moderate | High | Moderate |
| NCA | Moderate | 2000 | Moderate | High | Moderate |

-continued

| Chemical Composition | Relative Cost | Typical Cycle Life (cycles) | Relative Energy Density | Relative Power Capability | Relative Safety |
|---|---|---|---|---|---|
| LFP | High | 5000 | Low | High | High |
| LTO | Very High | 15000 | Very Low | Very High | Very High |

Each of the listed battery types could be said to have a substantially different chemical composition from the others. If a designer were given the task to design an energy storage system with a required cycle life of 5000 charge and discharge cycles, it is apparent from the table that lithium iron phosphate ("LFP") or lithium titanium oxide ("LTO") would be more appropriate selections, while lithium nickel manganese cobalt ("NMC") would not be, due to its relatively shorter cycle life. It is also apparent that the relative cost of such as system would be higher, as LFP and LTO are the two highest cost selections available. And because the energy densities of these two cell types are relatively lower, more cells would be required to achieve any given system capacity in Watt-hours.

Taking the foregoing exemplary information about the different relative characteristics of various energy storage sources/systems, for a large subset of possible energy storage performance requirements there exists a combination of two or more cell chemistries that can be configured into a single energy delivery system such that at least some characteristics of the system are enhanced over that achievable using only cells of a single chemistry.

In order to demonstrate advantages of embodiments of the present disclosure, an exemplary energy delivery system will now be described containing an energy storage system of a first battery stack containing LFP cells and a second battery stack containing NMC cells combined in a Watt-Hour capacity ratio of approximately 60% LFP and 40% NMC, which is configured to take advantage of the relatively longer life and enhanced safety characteristics of LFP, but at a lower cost point and smaller size due to the reduced relative cost and higher energy density characteristics of NMC. In accordance with exemplary embodiments of the present disclosure, system performance and characteristics may be further configurable by adjusting the cell chemistries and cell types used and the ratios in which they are combined. While the exemplary embodiments described hereinafter provide a system based on two stacks of energy storage elements, each based on different chemical compositions of lithium ion batteries, accordance with various embodiments of the present disclosure, other energy storage systems could be utilized, such as a system based on a first stack of battery cells and a second stack of ELDCs, which could be optimized for peak pulse power and allow faster recharge than is possible using batteries alone. In accordance with embodiments of the present disclosure, more than two energy storage systems (with at least two or more of such systems configured with different chemistry or energy storage technologies (e.g., selected from any potential energy storage systems, chemical energy storage systems, and/or kinetic energy storage systems) may be included to further customize the overall system performance and/or characteristics of the energy delivery system.

A battery cell can be modeled as an electronic circuit network as illustrated in FIG. 1 (e.g., see R. Rao et al., "Battery Modeling for Energy-Aware System Design," Computer, vol. 36, no. 12, pp. 77-87, December 2003 which is hereby incorporated by reference herein). A commonly accepted model includes an equivalent of an ideal voltage source representing the open circuit voltage (referred to herein as either "OCV" or "$V_{oc}$"), an internal series resistance ($R_s$) with a current ($I_s$) flowing therethrough, and a reactive component of combinations of series and/or parallel connected resistors and capacitors ($R_n C_n$), where L is the current flowing through the reactive component. Note that a model may include multiple (i.e., n, where n>1) RC elements that contribute to the total reactive component of the cell impedance.

The voltage ("$V_{batt}$") of the battery terminals under direct current ("DC") loading conditions is represented according to the following equation:

$$V_{batt} = V_{oc} - R_s I_s - \Sigma R_n I_n$$

The internal series resistance of the battery ($R_s + \Sigma R_n$) may be also referred to as the direct current internal resistance ("DCIR"). The DCIR changes as a function of the state of charge ("SOC") of the battery.

Figure 2:
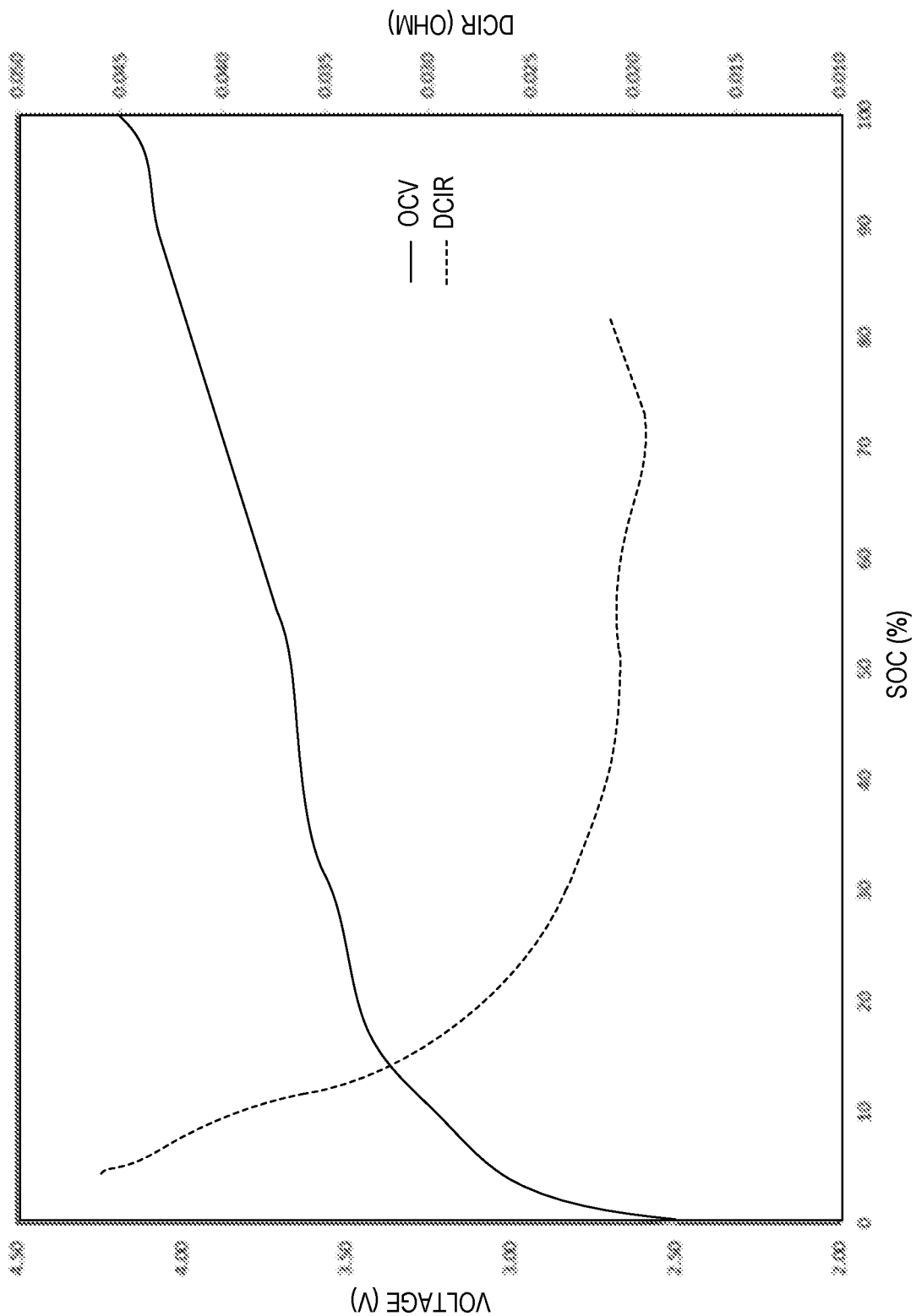
FIG. 2 illustrates plots of direct current internal resistance ("DCIR") and open circuit voltage as a function of state of charge for an exemplary battery cell.

FIG. 2 illustrates a graph depicting both battery cell DCIR and OCV as a function of SOC for a typical NMC battery cell. The higher the state of charge, the higher the $V_{oc}$ voltage, and the lower the DCIR. The DCIR increases at low states of charge, and especially increases below about thirty percent (30%) SOC.

Note that time-based components may account for transient responses and Faradaic contributions during abrupt load changes and charge and/or discharge cycles. When considering the overall behavior of the battery cell under DC loading conditions where currents do not vary with time, the resistive elements can be summed and the capacitive elements can be ignored, and thus the model can be simplified to:

$$V_{batt} = V_{oc} - R_{batt} I_{batt}$$

Figure 3:
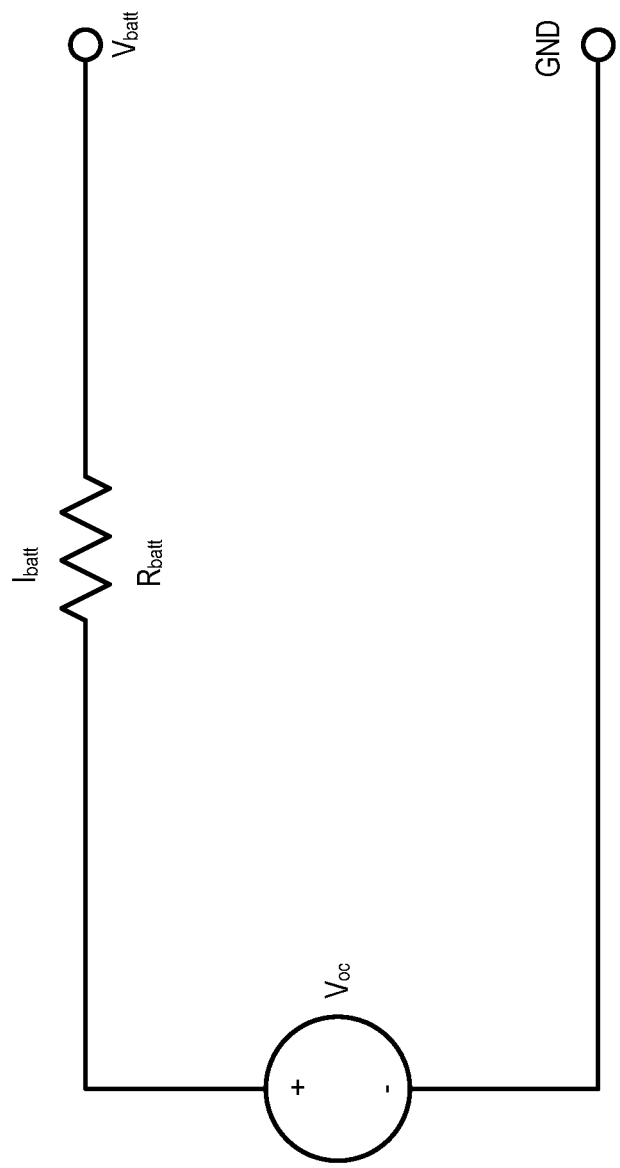
FIG. 3 illustrates a schematic diagram of a model for battery cell under direct current loading conditions.
Figure 4:
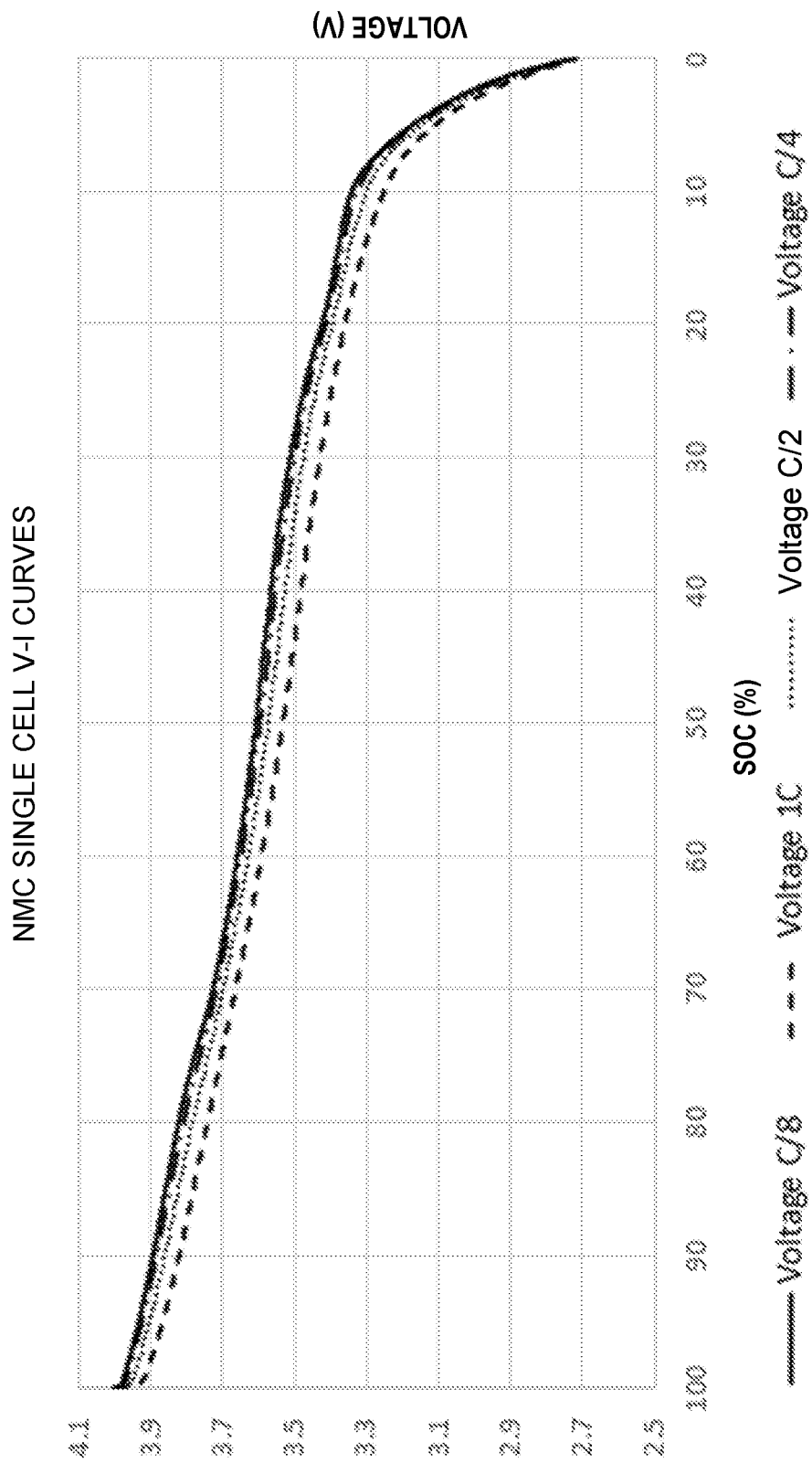
FIG. 4 illustrates a graph of a family of characteristic voltage versus state of charge curves, each curve representing a different level of battery current for an exemplary single battery cell.

This simplified cell model is illustrated in FIG. 3. As a result, $V_{batt}$ can be characterized by a family of voltage versus SOC curves at various currents (also referred to herein as characteristic V-I curves) taken at different $I_{batt}$ current values. This family of characteristic V-I curves for a typical single NMC cell is illustrated in FIG. 4. (In FIG. 4 and the other figures illustrating graphs of voltage versus SOC curves, the lines represent voltages at different current values as related to C, the rated capacity of the battery.)

Figure 5:
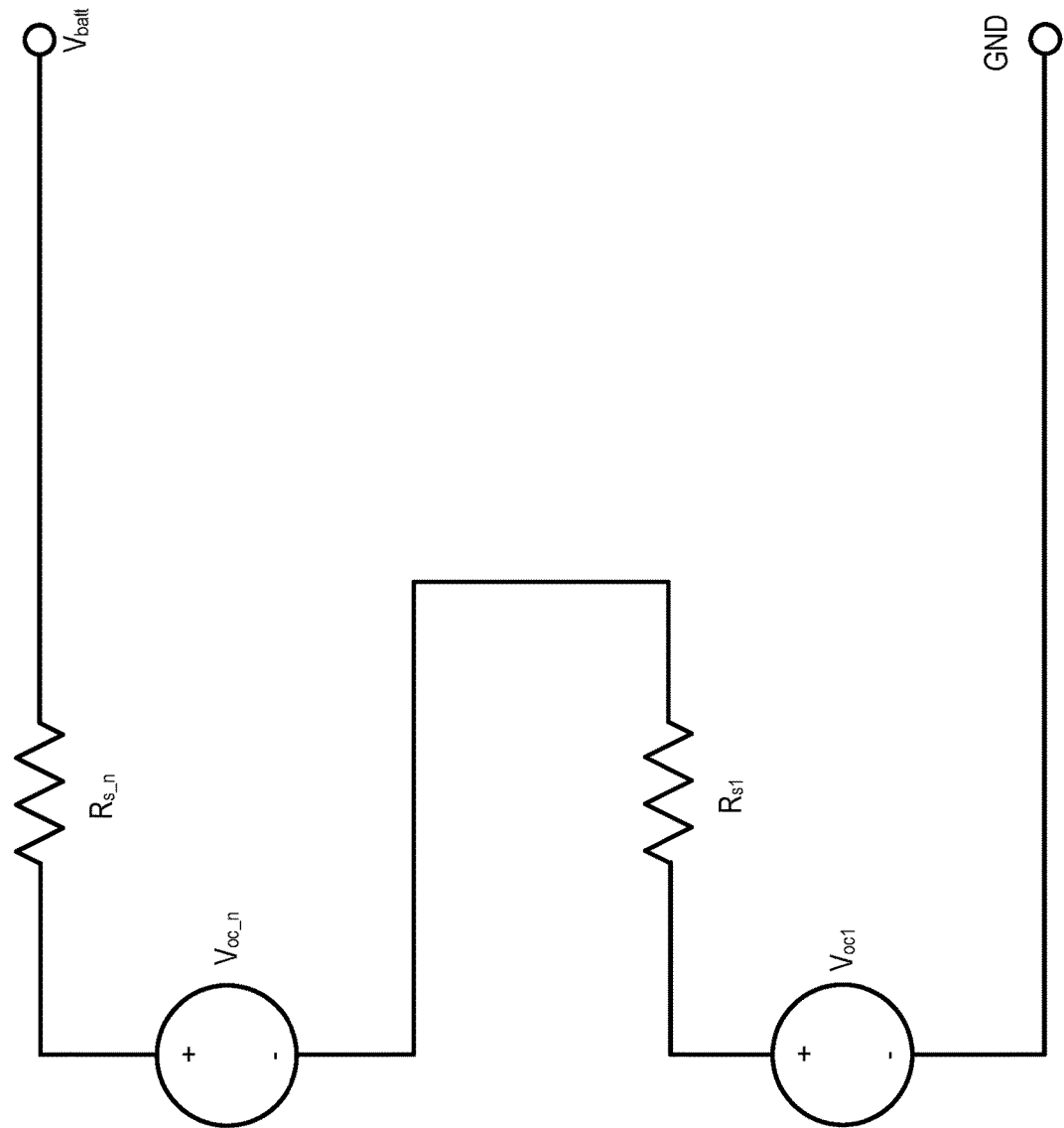
FIG. 5 illustrates a schematic diagram of a model for multiple battery cells coupled in series.
Figure 6:
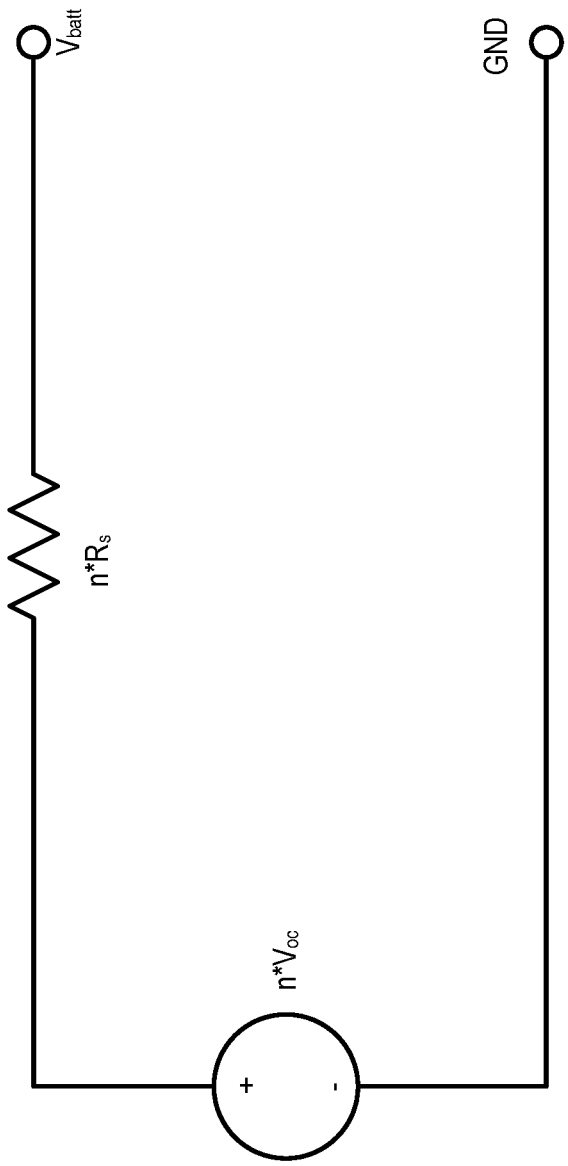
FIG. 6 illustrates a schematic diagram of a simplified model for multiple battery cells coupled in series.

Referring to FIG. 5, when multiple (n) identical battery cells are coupled in series, the model can be represented as:

$$V_{batt} = n(V_{oc} - R_{batt} I_{batt})$$

where n is the number of battery cells in series. A simplified model is depicted in FIG. 6.

Figure 7:
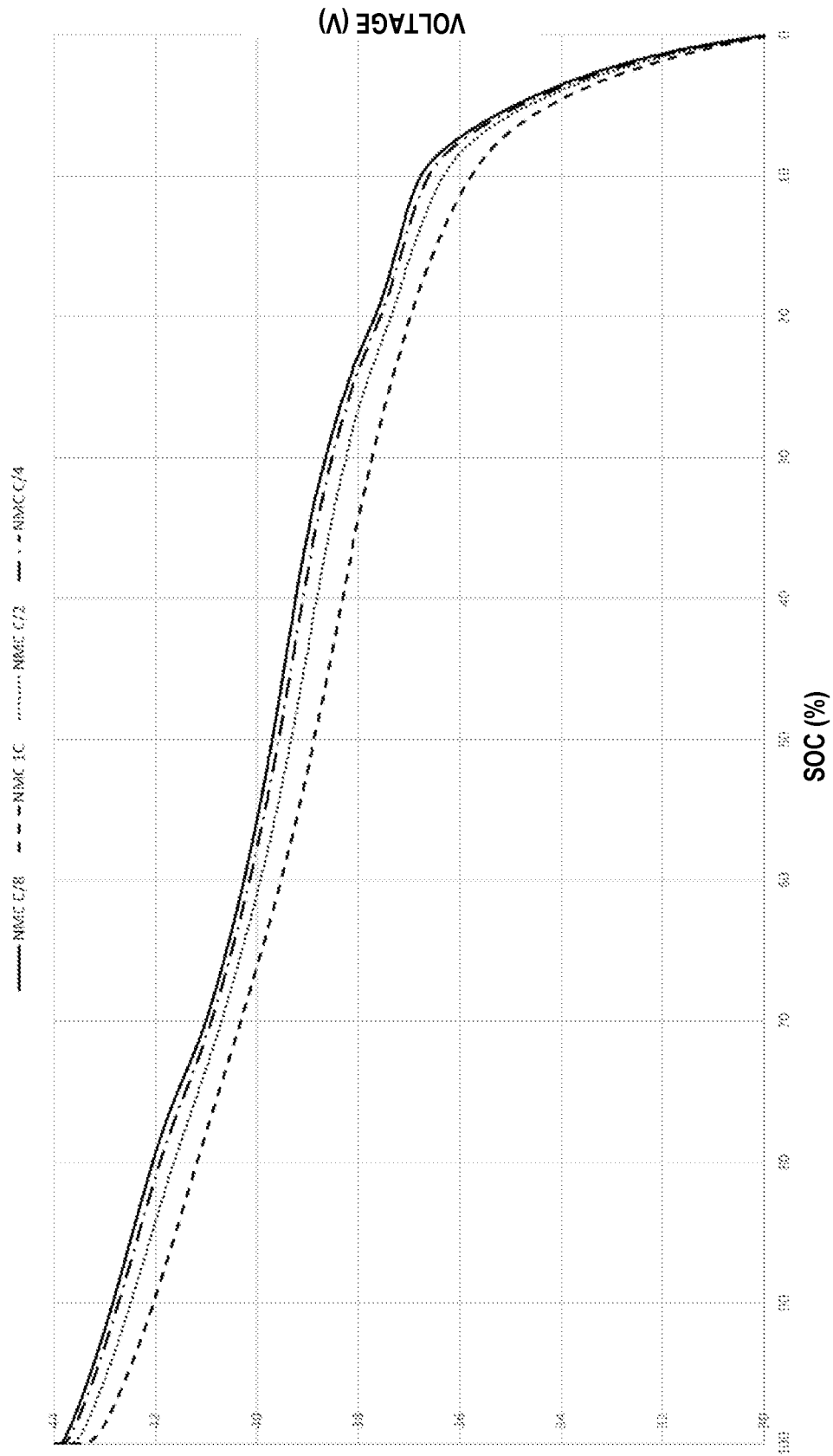
FIG. 7 illustrates a graph of a family of characteristic voltage versus state of charge curves, each taken at a different cell stack current level for an exemplary battery cell stack.

Referring to FIG. 7, as with the previously described example of a single battery cell, a family of exemplary characteristic V-I curves can be produced for such a series connected cell system (in this non-limiting example, a battery stack of the previously described typical NMC cells, where 11 cells are connected in series).

Figure 8:
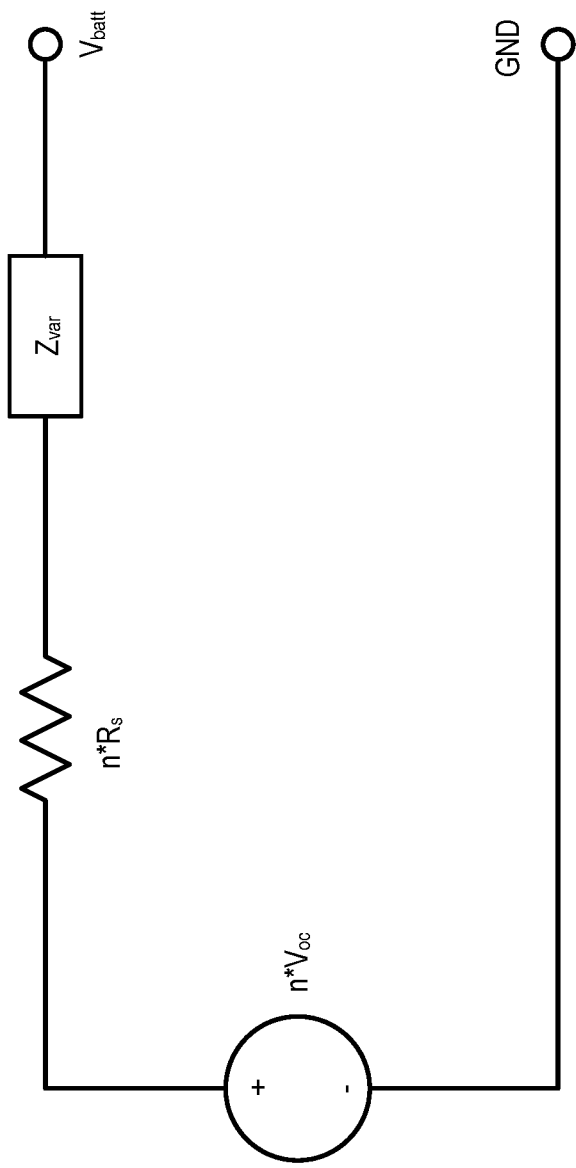
FIG. 8 illustrates a schematic diagram of a model for a battery cell stack coupled with a variable impedance network.

Referring to FIG. 8, the battery stack may be coupled to a variable impedance circuit (referred to herein as either "$Z_{var}$" or "$Z_{variable}$"). The $Z_{var}$ term represents the variable impedance of the circuit, which may be configured as a network of switchable elements (as such, the variable impedance circuit will also be referred to herein as a "variable impedance network"). For any given output current value, the $Z_{var}$ term allows each energy source (e.g., battery cell stack) so equipped to move its $V_{batt}$ output characteristic curve position down relative to its normal characteristic voltage curve position (that is the discharge curve observed when $Z_{var}=0$) by adjusting the value of $Z_{var}$.

Figure 9:
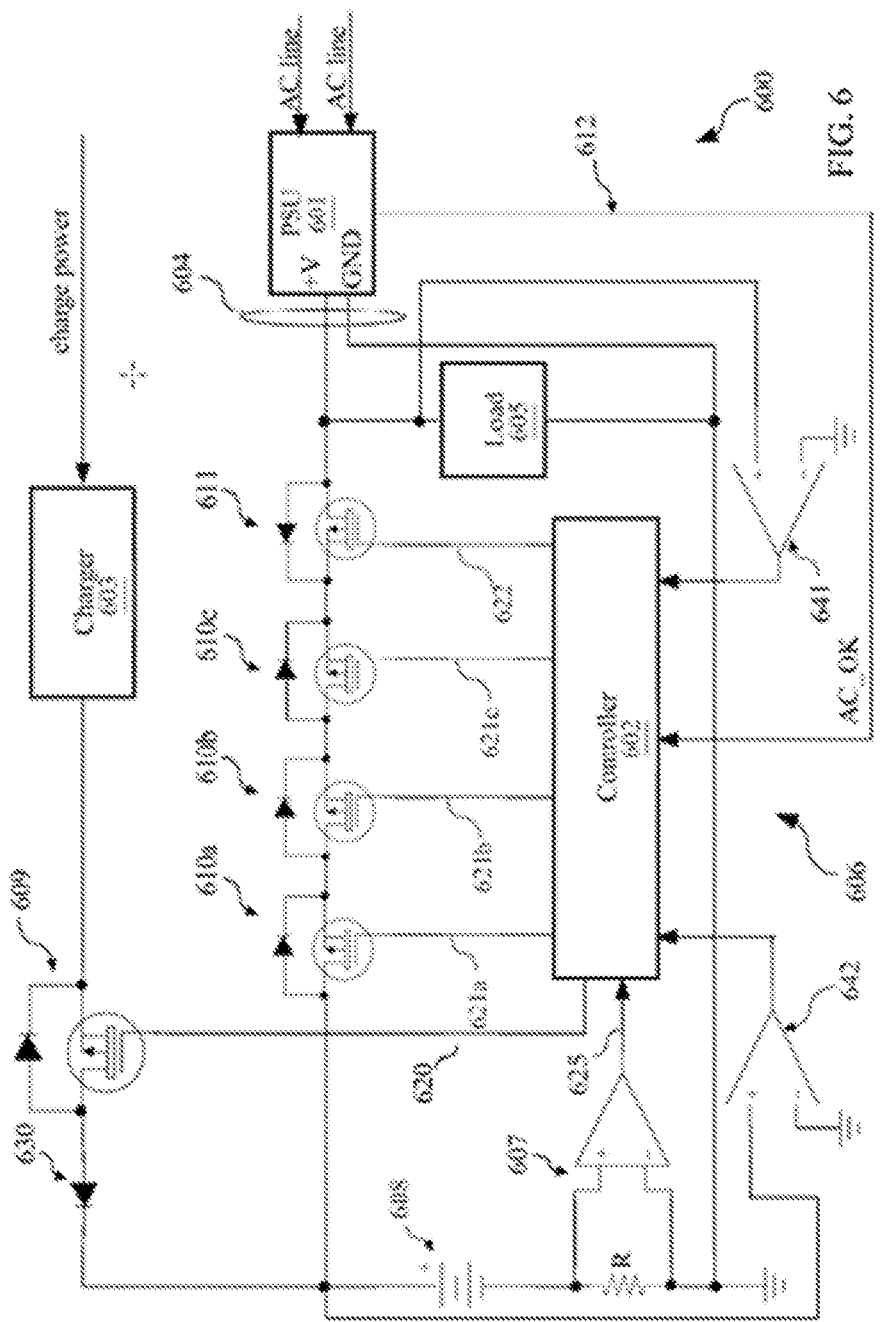
FIG. 9 illustrates a circuit block diagram in which a variable impedance network includes a plurality of switchable diodes coupled in series.

Embodiments of the present disclosure may be configured to utilize any appropriate circuitry within a variable impedance circuit and/or network. International patent application no. PCT/US2017/068301 (hereinafter referred to as "PCT/US2017/068301") discloses exemplary implementations of circuitry that includes switchable elements that may be utilized within a variable impedance network in accordance with various embodiments of the present disclosure as will be described herein. As illustrated in FIG. 9, a first implementation as disclosed in PCT/US2017/068301 (FIG. 6 from PCT/US2017/068301 is provided as FIG. 9) utilizes a number of series-connected switchable diode circuits 610a . . . 610c, which may be selectively inserted or removed (using switching elements, e.g., FETs) from the circuit in accordance with a control algorithm performed by a control system 602, which may be monitoring the system 600 in real time. While the embodiment illustrated in FIG. 9 shows three series-connected switchable diode circuits 610a-610c, more or fewer such switchable diode circuits may be utilized depending on the exact system configuration and end use requirements. Note that the remaining elements illustrated in FIG. 9 are not further described for the sake of simplicity, but may be referenced by reviewing PCT/US2017/068301.

Figure 10:
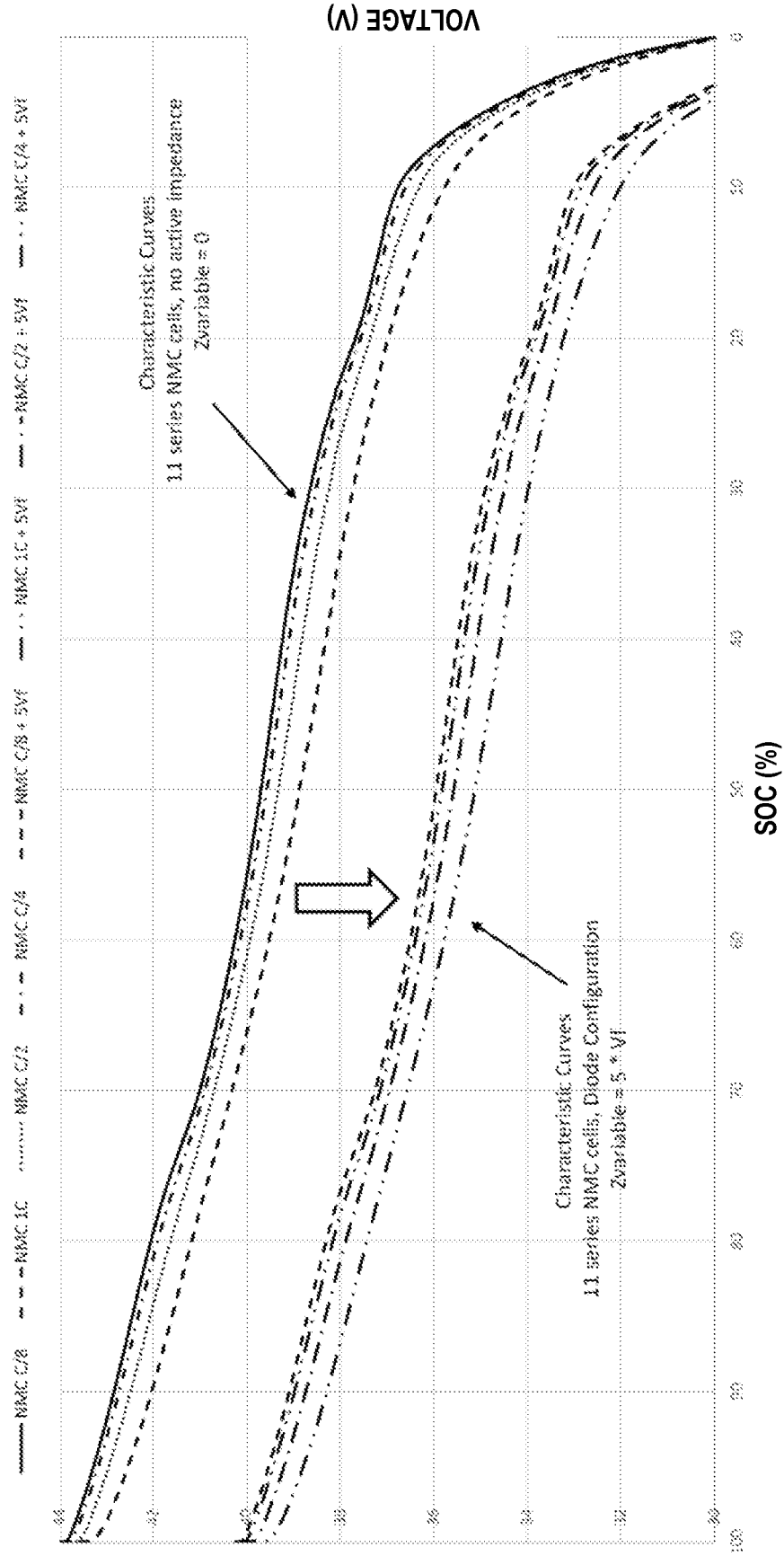
FIG. 10 illustrates a graph demonstrating an example of the effect on a family of characteristic voltage versus state of charge curves for an exemplary battery cell stack as a result of introducing a plurality of switchable diodes coupled in series.

FIG. 10 illustrates the effect on the position of the characteristic curves when a number of series-connected diodes (in this case, five ideal diodes) are introduced into the circuit. Notice that each of the characteristic curves is shifted down (lowered in voltage) by the same amount relative to no inserted impedance (i.e., $Z_{variable}=0$). In this non-limiting example, $Z_{variable}=5*Vf$, where Vf is the forward voltage of an ideal diode. Note that battery current has no effect in the level of this shift; the curves for each current level are shifted by the same amount. The variable nature of this embodiment using series-connected switchable diodes results from the fact that any number of diodes (i.e., from zero diodes up to a maximum number of implemented diodes) may be added or removed from the circuit at any time. Thus, the characteristic V-I curves associated with an implemented battery cell stack may be shifted up or down at any time during operation of an energy delivery system configured with such a variable impedance network.

Figure 11:
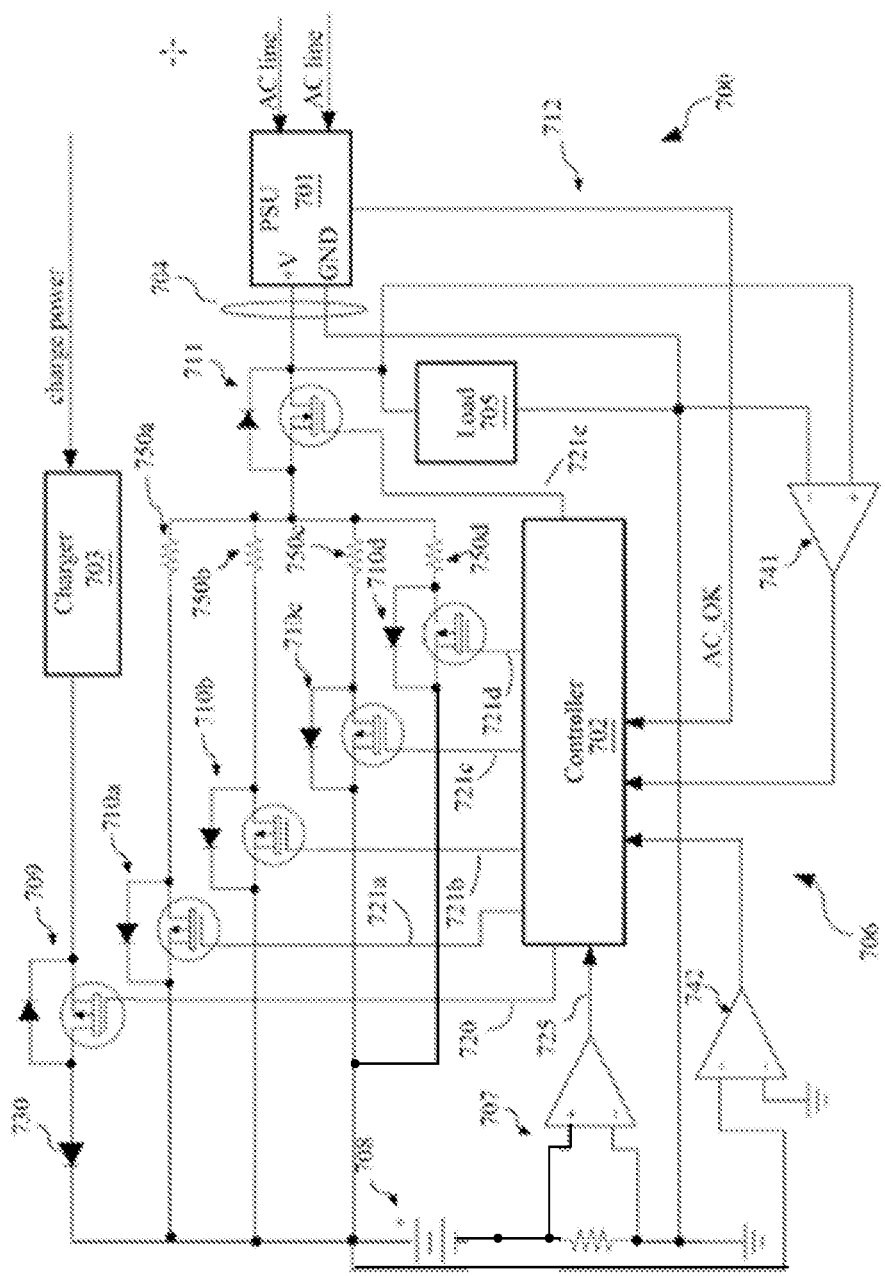
FIG. 11 illustrates a circuit block diagram in which a variable impedance network includes a plurality of switchable resistive elements coupled in parallel.

FIG. 11 provides a second exemplary implementation of circuitry that includes switchable elements disclosed in PCT/US2017/068301 (FIG. 7 from PCT/US2017/068301 is provided as FIG. 11). In this exemplary implementation, the circuitry that includes switchable elements is configured as a parallel connection of switchable resistive elements 750a-750d. Each switchable resistive element may be selectively inserted or removed (using switching elements, e.g., FETs) from the circuit in accordance with a control algorithm performed by a control system 702, and the total impedance of the switchable resistor network is determined by the number of switchable resistive elements that are switched on or off at a given time. In much the same way as described with respect to FIG. 9, adding or subtracting resistance in such circuitry will result in a shift in position of the characteristic V-I curves of the battery cell stack. Note that the remaining elements illustrated in FIG. 11 are not further described for the sake of simplicity, but may be referenced by reviewing PCT/US2017/068301.

Figure 12:
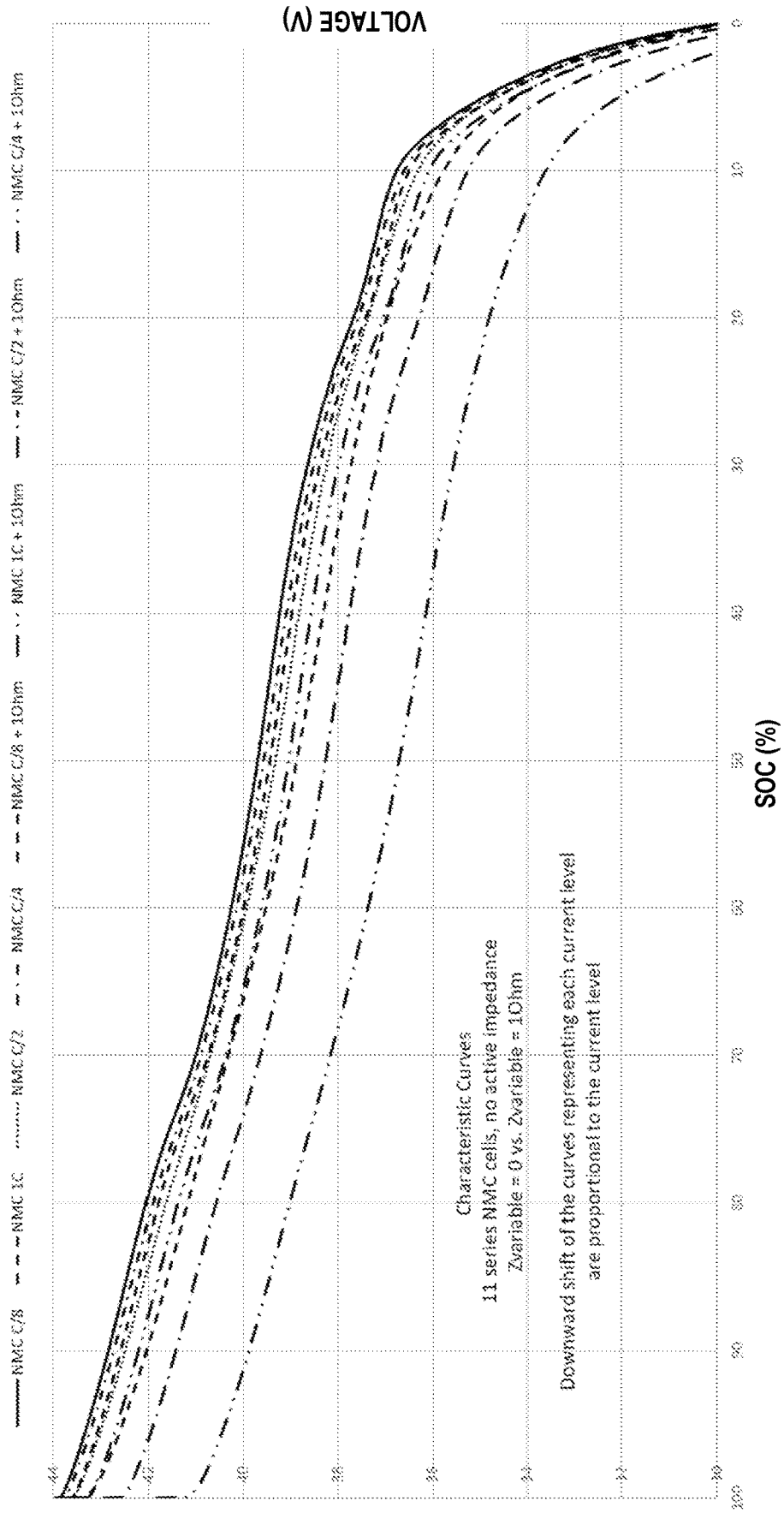
FIG. 12 illustrates a graph demonstrating an example of the effect on a family of characteristic voltage versus state of charge curves for an exemplary battery cell stack as a result of introducing a resistive element.

FIG. 12 illustrates a comparison between the characteristic curves with the circuitry that includes switchable resistive elements set to a value of 0 ohms (i.e., $Z_{variable}=0$), and the curves with the circuitry that includes switchable resistive elements set to a value of 1 ohm (i.e., $Z_{variable}=1$ ohm). As can be seen, the resulting characteristic shift is different in nature than that demonstrated with respect to the exemplary implementation when switchable diodes are implemented. Rather than shifting all curves downward by an equal amount as shown in FIG. 10, the magnitude of the downward shift of each curve is proportional to the current represented by each curve. This results in a "spreading apart" of the various characteristic curves, rather than a downward shift of all the curves by a fixed voltage value. The voltage drop across a resistor is current x resistance, while the voltage drop across an ideal diode is a fixed voltage independent of current. Therefore, in the case of a network of switchable resistive elements, the effect on the characteristic V-I curves depends on the current (for example, a zero current results in a zero voltage drop, a 1X current results in a 1X voltage drop, a 2X current results in a 2X voltage drop, etc.). This means the characteristic V-I curve at each particular current level will "spread" as a function of the resistance; higher inserted resistance results in more spread. In the case of switchable diodes, the forward voltage drop is fixed, regardless of the current magnitude. Therefore, all of the characteristic V-I curves are shifted downward by the number of diodes switched into the circuit (i.e., the number of diodes not shorted by switches). One diode will shift all of the curves down by the same amount (e.g., Vf=0.75 V); two diodes will shift down the curves by 1.5 V; 5 diodes will shift down the curves by 3.75 V, and so forth, regardless of the magnitude of the current present in the diodes.

Figure 13:
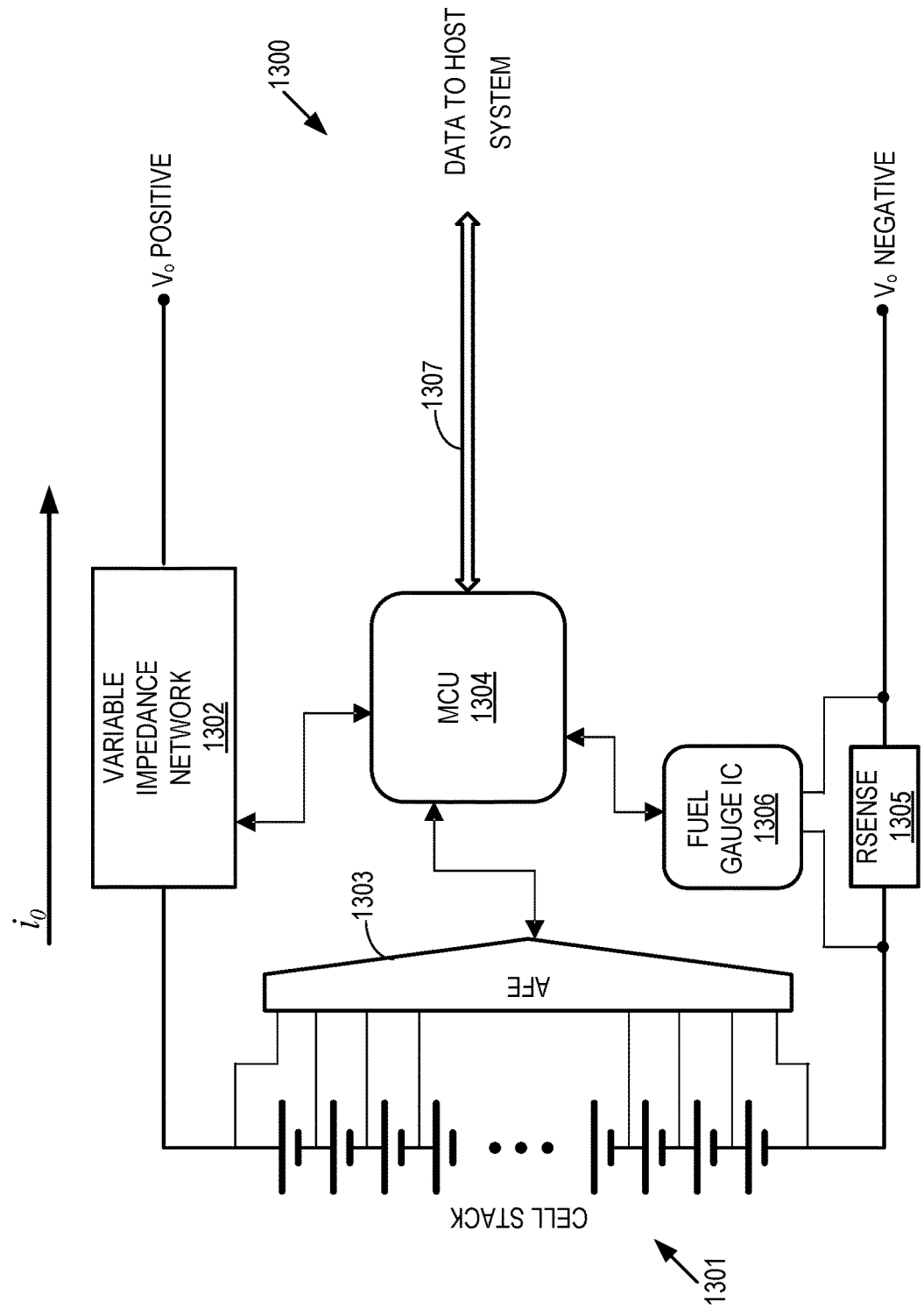
FIG. 13 illustrates a block diagram of an energy delivery system.

Referring to FIG. 13, there is illustrated a system 1300, in which a battery stack 1301 containing a plurality of series connected battery cells and a variable impedance network 1302 presents a voltage at the $V_o$ Positive terminal. Each cell in the battery stack 1301 has its voltage monitored by an analog front end measurement device ("AFE") 1303. The AFE 1303 may also collect temperature data, and deliver the collected data to a control system (e.g., a microcontroller "MCU") 1304. The battery stack 1301 may be coupled to $V_o$ Negative through a sense resistor (Rsense) 1305. Each side of the sense resistor 1305 may be coupled to a fuel gauge integrated circuit ("IC") 1306 providing a voltage that represents the value of battery current ($i_o$) to the fuel gauge IC 1306 whenever current is present in the sense resistor 1305. The fuel gauge IC 1306 may communicate information as to the state of charge ("SOC") of the battery stack 1301 with the MCU 1304. The MCU 1304 is coupled to and controls the variable impedance network 1302. The MCU 1304 may perform one or more control algorithms configured to control (e.g., optimize) an operating state of the system 1300 in a predetermined manner. For example, a control algorithm operated by the control system 1304 may be configured to determine the state of the battery stack 1301 and manipulate the variable impedance network 1302 to control (e.g., adjust or modify) the voltage presented to the $V_o$ Positive terminal of the system 1300 by adjusting the position(s) of the characteristic V-I curves that determine this parameter. The MCU 1304 may be configured to communicate data and/or information to an outside host system (e.g., via a communication link or bus 1307).

Figure 14:
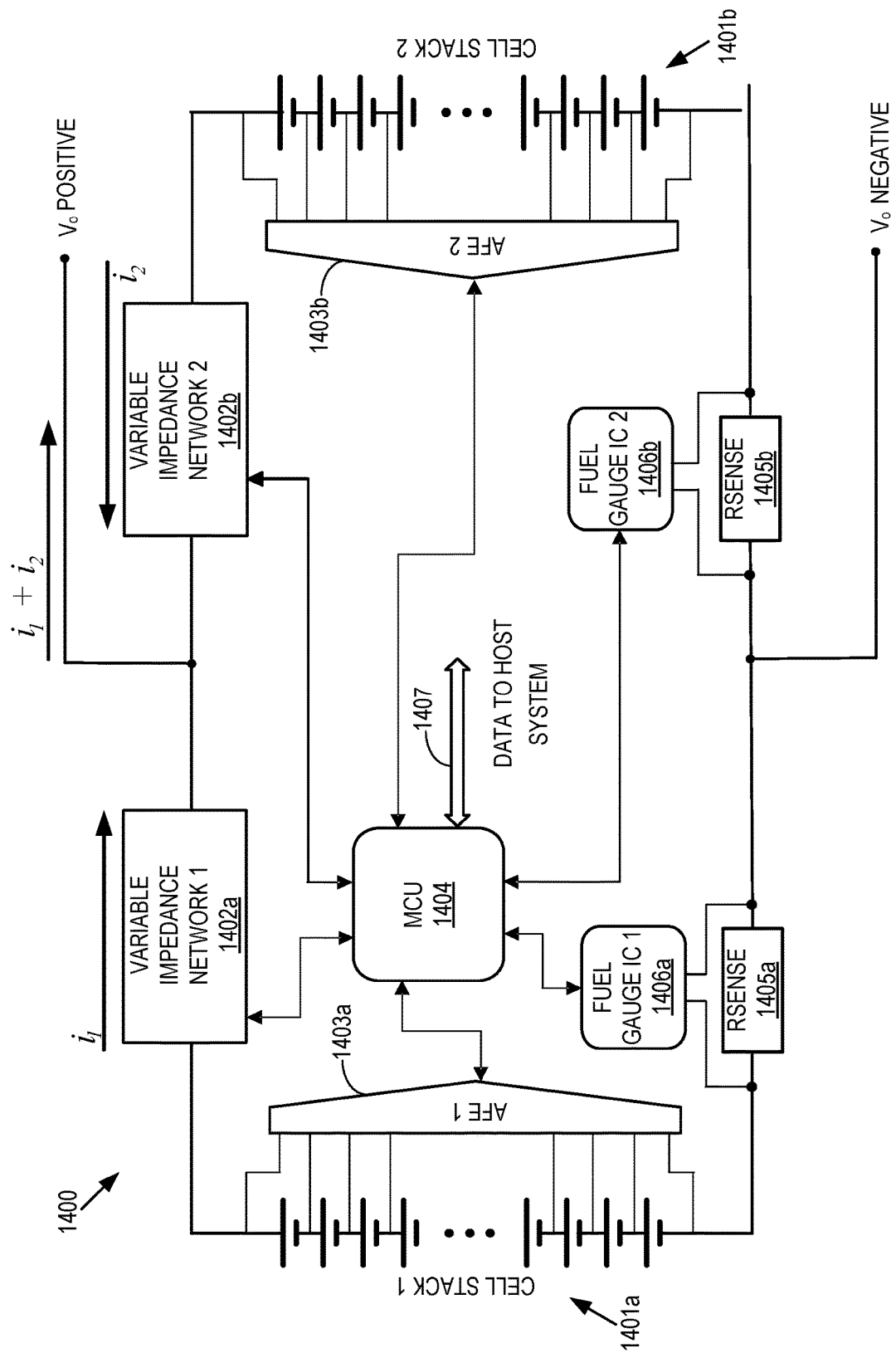
FIG. 14 illustrates a block diagram of an energy delivery system configured in accordance with embodiments of the present disclosure.

Referring to FIG. 14, there is illustrated an energy delivery system 1400 configured in accordance with embodiments of the present disclosure. In the energy delivery system 1400, a first battery cell stack 1401a is coupled in parallel to a second battery cell stack 1401b, where each may be coupled to similar control and monitoring circuits. The battery cell stacks 1401a, 1401b may be coupled to a common control system (e.g., a microcontroller "MCU")

1404 such that parametric information from each battery stack can be collected (e.g., simultaneously) and control algorithms performed to control operations of either or both of the variable impedance networks 1402a, 1402b. The voltage of each cell in the battery stack 1401a may be monitored by an analog front end measurement device ("AFE") 1403a. The AFE 1403a may also collect temperature data, and deliver the collected data to the control system 1304. The battery stack 1401a may be coupled to $V_o$ Negative through a sense resistor (Rsense) 1405a. Each side of the sense resistor 1405a may be coupled to a fuel gauge integrated circuit ("IC") 1406a providing a voltage that represents the value of battery current ($i_1$) to the fuel gauge IC 1406a whenever current is present in the sense resistor 1405a. The fuel gauge IC 1406a may communicate information as to the state of charge ("SOC") of the battery stack 1401a with the control system 1404. The voltage of each cell in the battery stack 1401b may be monitored by an AFE 1403b. The AFE 1403b may also collect temperature data, and deliver the collected data to the control system 1304. The battery stack 1401b may be coupled to $V_o$ Negative through a sense resistor (Rsense) 1405b. Each side of the sense resistor 1405b may be coupled to a fuel gauge IC 1406b providing a voltage that represents the value of battery current ($i_2$) to the fuel gauge IC 1406b whenever current is present in the sense resistor 1405b. The fuel gauge IC 1406b may communicate information as to the SOC of the battery stack 1401b with the control system 1304. Essentially, the fuel gauge ICs 1406a, 1406b may be configured to measure instantaneous current and even battery temperature, and then calculate from measured data or data delivered to it digitally an average current, instantaneous state of charge, number of charge/discharge cycles experienced by the battery stack, resistance of the battery stack, and other parameters.

Note that in accordance with certain embodiments of the present disclosure, the $V_o$ Positive output terminal is common between the variable impedance networks 1402a, 1402b. As a result, in accordance with embodiments of the present disclosure, rather than controlling the output voltage presented to the terminal $V_o$ Positive as performed within the system 1300, the variable impedance networks 1402a, 1402b under selective control by signals from the control system 1404 may be configured to control a level of current flowing through each variable impedance network 1402a, 1402b and delivered to the output terminal. The selective control of the variable impedance networks 1402a, 1402b by the control system 1404 may be performed such that each of the battery stacks 1401a, 1401b is maintained in a predetermined output current range in accordance with predetermined performance criteria of the energy delivery system 1400.

The control system 1404 may be configured to communicate data and/or information to an outside host system (e.g., via a communication link or bus 1407). Internal communications between the various components and/or externally from the control system 1404 may be wired or wireless. Communication protocols that may be utilized include, but are not limited to, SMB, I2C, RS232, TTL, Serial, USB, CAN, Network, etc.

In a non-limiting example, the variable impedance networks 1402a, 1402b may contain a plurality of switchable resistive elements such as the configuration of switchable resistive elements 750a . . . 750d utilized in the system 700 of FIG. 11. Each switch 710a . . . 710d can be individually opened or closed by the control system 1404 according to predetermined control algorithms. The resistors 750a . . . 750d may be configured with the same or different resistance values. By altering the number of resistors 750a . . . 750d that are coupled in parallel by their corresponding switches 710a . . . 710d, the effective resistance of either or both of the variable impedance networks 1402a, 1402b can be adjusted over a predetermined range (e.g., from a predetermined minimum resistance value to a predetermined maximum resistance value).

Figure 15:
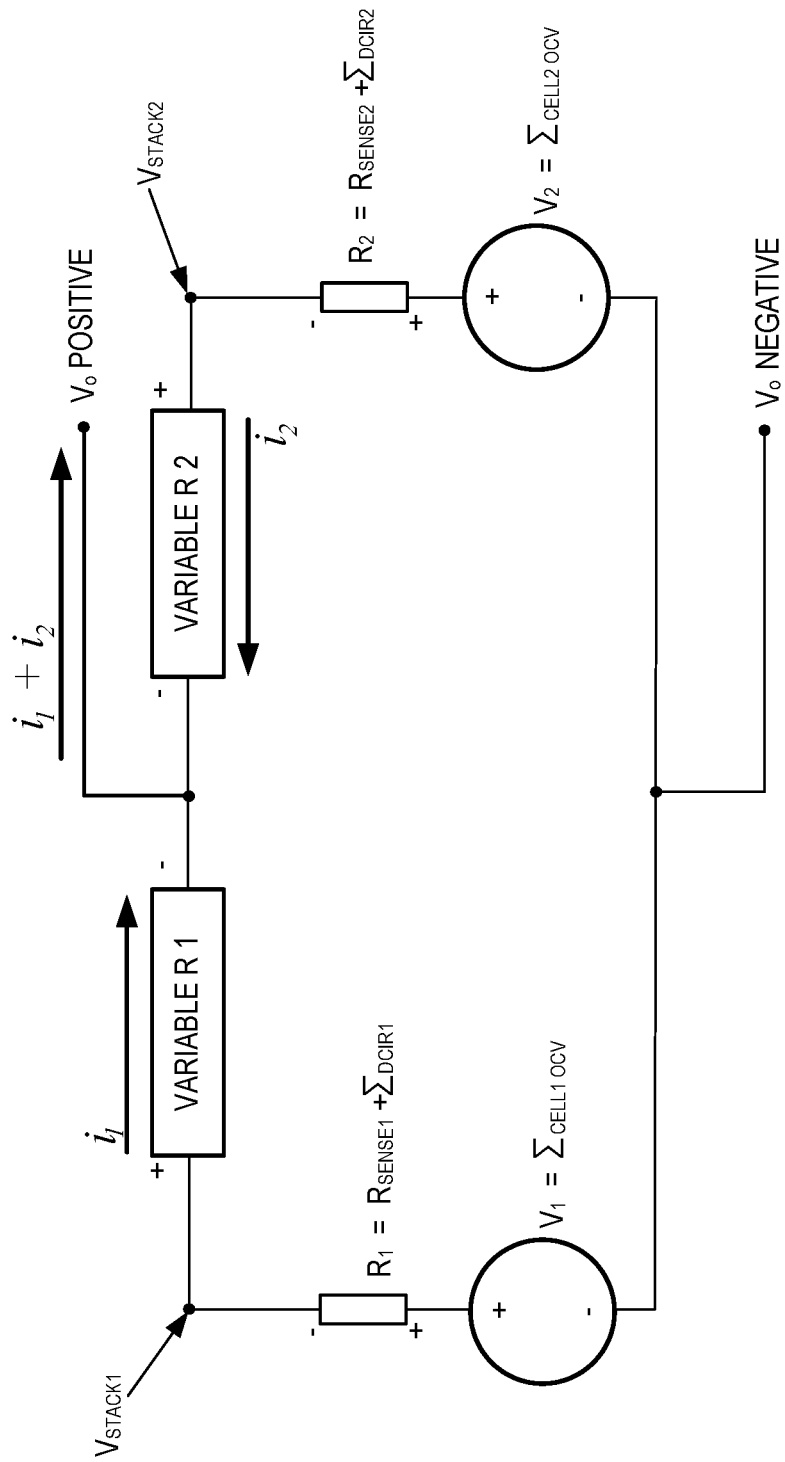
FIG. 15 illustrates a schematic diagram of a model for the energy delivery system of FIG. 14.

The energy delivery system 1400 may be represented by the simplified model illustrated in FIG. 15, which can be described by the equations:

$$V_o \text{ Positive} = V_1 - R_1 * i_1 - i_1 * \text{Variable } R1$$

$$V_o \text{ Positive} = V_2 - R_2 * i_2 - i_2 * \text{Variable } R2$$

$$i_1 + i_2 = i \text{ output}$$

Consider an exemplary embodiment of the present disclosure in which the energy delivery system 1400 contains battery cell stacks that have different sets of operating parameters (e.g., because of different materials and/or chemical compositions), where cell stack 1401a includes cells configured with a higher cycle life relative to the cells in the cell stack 1401b includes cells configured with a lower cycle life relative to the cell stack 1401a, but may also include cells with a higher relative energy density. Assume the energy capacities of the two cell stacks is about the same. In accordance with embodiments of the present disclosure, it might be advantageous for an operation of the energy delivery system 1400 that during discharge, the cell stack that has the higher relative cycle life (i.e., the cell stack 1401a) delivers most of the energy. For example, in accordance with embodiments of the present disclosure, the control system 1404 may be configured so that during discharge, the current drawn from the cell stack 1401a is twice that drawn from the cell stack 1401b, or in other words, the cyclic energy drawn from the cell stack 1401a is twice that drawn from the cell stack 1401b, so as to leverage the longer cycle life of the cell stack 1401a. Under such an exemplary operating scenario, the equations may be rewritten as follows:

$$i_1 = 2 * i_2 \text{ ($i_1$ is always 2 times $i_2$)}$$

$$V_o \text{ Positive} = V_1 - R_1 * 2 * i_2 - 2 * i_2 * \text{Variable } R1; \text{ and}$$

$$V_o \text{ Positive} = V_2 - R_2 * i_2 - i_2 * \text{Variable } R2$$

The values $V_1$, $V_2$, $R_1$, and $R_2$ may be known from cell characterization curves associated with the types of battery cells utilized in the cell stacks 1401a, 1401b (such as that illustrated in FIG. 2), and thus it is trivial to solve the equations for the values for Variable R1 and Variable R2 to maintain the $i_1 = 2 * i_2$ condition and thus configure the variable impedance networks 1402a, 1402b with the appropriate values.

Figure 16:
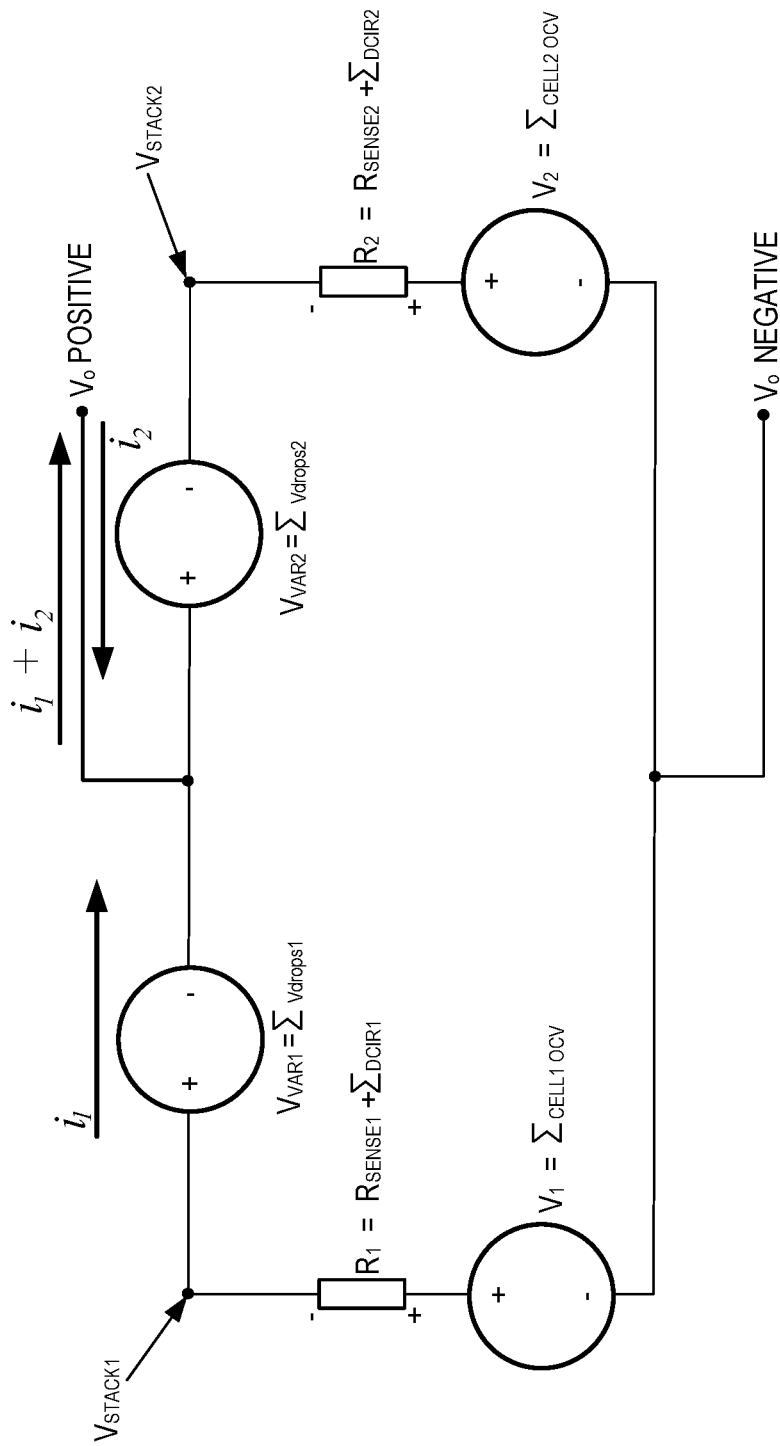
FIG. 16 illustrates a schematic diagram of a model of the energy delivery system of FIG. 14 in which a plurality of switchable diodes is coupled in series within the variable impedance networks.

The energy delivery system 1400 may also be represented by the simplified model illustrated in FIG. 16, wherein the variable impedance networks 1402a, 1402b each include a plurality of switchable diodes such as the configuration of switchable diodes 610a . . . 610c utilized in the system 600 of FIG. 9. Each of the switchable diodes 610a . . . 610c is coupled with a switch (e.g., FET) that can bypass any current around the diode. The switches can be opened or closed according to control signals (e.g., similar to the control signals 621a . . . 621c of FIG. 9) received from the control system 1404. Each of the diodes may be configured with the same or different forward voltage drop (Vf) values. The number of diodes that have their associated switches open and thus contribute a forward voltage drop and the number of diodes that have their associated switches closed and thus do not contribute a forward voltage drop to their associated variable impedance networks 1402a, 1402b is adjustable by the control system 1404, and the sum of the voltage drops is therefore variable.

As with the example described with respect to FIG. 15, this system can be described by the equations:

$$V_o \text{ Positive} = V_1 - V_{var1} - i_1 * R_1$$

$$V_o \text{ Positive} = V_2 - V_{var2} - i_2 * R_2$$

$$i_1 + i_2 = i \text{ output}$$

Again, as in the previous example, consider that the energy delivery system 1400 includes two different battery cells, e.g., where the cell stack 1401a includes cells configured with a very high cycle life relative to the cell stack 1401b, and the cell stack 1401b includes cells configured with lower cycle life relative to the cell stack 1401a, but may also include a higher relative energy density. Assume the energy capacity of the two cell stacks is about the same. And, as with the previous example, consider a energy delivery system 1400 in which it is desired that $i_1 = 2*i_2$, thus, the equations are rewritten as follows:

$$i_1 + i_2 = i \text{ output}$$

$$i_1 = 2*i_2 \ (i_1 \text{ is always 2 times } i_2)$$

$$V_o \text{ Positive} = V_1 - V_{var1} - 2*i_2 * R_1$$

$$V_o \text{ Positive} = V_2 - V_{var2} - i_2 * R_2$$

The values $V_1$, V2, R1, and R2 are again known from cell characterization curves such as that illustrated in FIG. 3 and thus it is trivial to solve the equations for the exact values for Vvar1 and Vvar2 to maintain the i1=2*i2 condition and configure the number of active diodes in each impedance network with the appropriate values.

The values $V_1$, $V_2$, $R_1$, and $R_2$ may be known from cell characterization curves associated with the types of battery cells utilized in the cell stacks 1401a, 1401b (such as that illustrated in FIG. 2), and thus it is trivial to solve the equations for the values for $V_{var1}$ and $V_{var2}$ to maintain the $i_1=2*i_2$ condition and thus configure the number of active diodes in each variable impedance network 1402a, 1402b with the appropriate values. It is important to note that since the value of Vf for each diode is of a fixed and characteristic value depending on the semiconductor technology and device type, the exact value of each of the variable impedance networks 1402a, 1402b is not precisely adjustable, but rather is of some fixed multiple of Vf values.

In accordance with embodiments of the present disclosure, implementations of the energy delivery system 1400, whether implemented with the variable impedance networks 1402a, 1402b utilizing switchable resistive elements, switchable diodes, or a combination thereof, may utilize control algorithms programmed within the control system 1404 that embody the mathematical expressions described with respect to either FIG. 15 or FIG. 16, as the case may be, in order to control the switching of the resistive elements or diodes within the variable impedance networks 1402a, 1402b. Additionally, in accordance with embodiments of the present disclosure, the battery cell specific values $V_1$, $V_2$, $R_1$, and $R_2$ may be determined from their individual cell characterization curves. Since such values are quite variable with state of charge, temperature, and age of the cells, such values may be incorporated into some sort of appropriate database, such as lookup tables, to capture characterized data and create models to estimate aging characteristics.

In accordance with embodiments of the present disclosure, the control system 1404 may utilize control algorithms based on successive approximation. For example, when the energy delivery system 1400 is initialized and before any discharge of any energy commences, initial states of the variable impedance networks 1402a, 1402b may be configured (e.g., by solving the descriptive equations). Then, once discharge has commenced, rather than the control system 1404 performing continuous equation processing, the control system 1404 may repetitively loop through a parametric measurement step, where dynamically changing operating conditions of the energy delivery system 1400, such as voltage, current, and SOC of each cell stack 1401a, 1401b are measured, followed by a comparison step, where the output currents or other selected parameters of each cell stack 1401a, 1401b are compared against each other and against a targeted performance, and then a correction step is performed where the variable impedance networks 1402a, 1402b are adjusted (e.g., in small, discrete steps) to move the controlled parameters toward a desired behavior with each adjustment. A delay may be added in the loop to allow the battery parameters to stabilize after each adjustment to either of the variable impedance networks 1402a, 1402b. For example, using the previous example of the energy delivery system 1400 described with respect to FIG. 14, control system 1404 may be configured to constantly maintain $i_1$ and $i_2$ to be equal, or it to be a fixed percentage of $i_2$, or it to be a fixed percentage of $i_2$ only when the SOC of the cell stack 1401a is above 25% and a different fixed percentage when the SOC of the cell stack 1401a is below 25%, or to reduce the current of the cell stack with the highest temperature to 10% of the current of the cell stack with the lowest temperature whenever the difference between the cell stack temperatures reaches some threshold. The foregoing examples are non-limiting on the possible variations in control algorithms that are possible.

Figure 17:
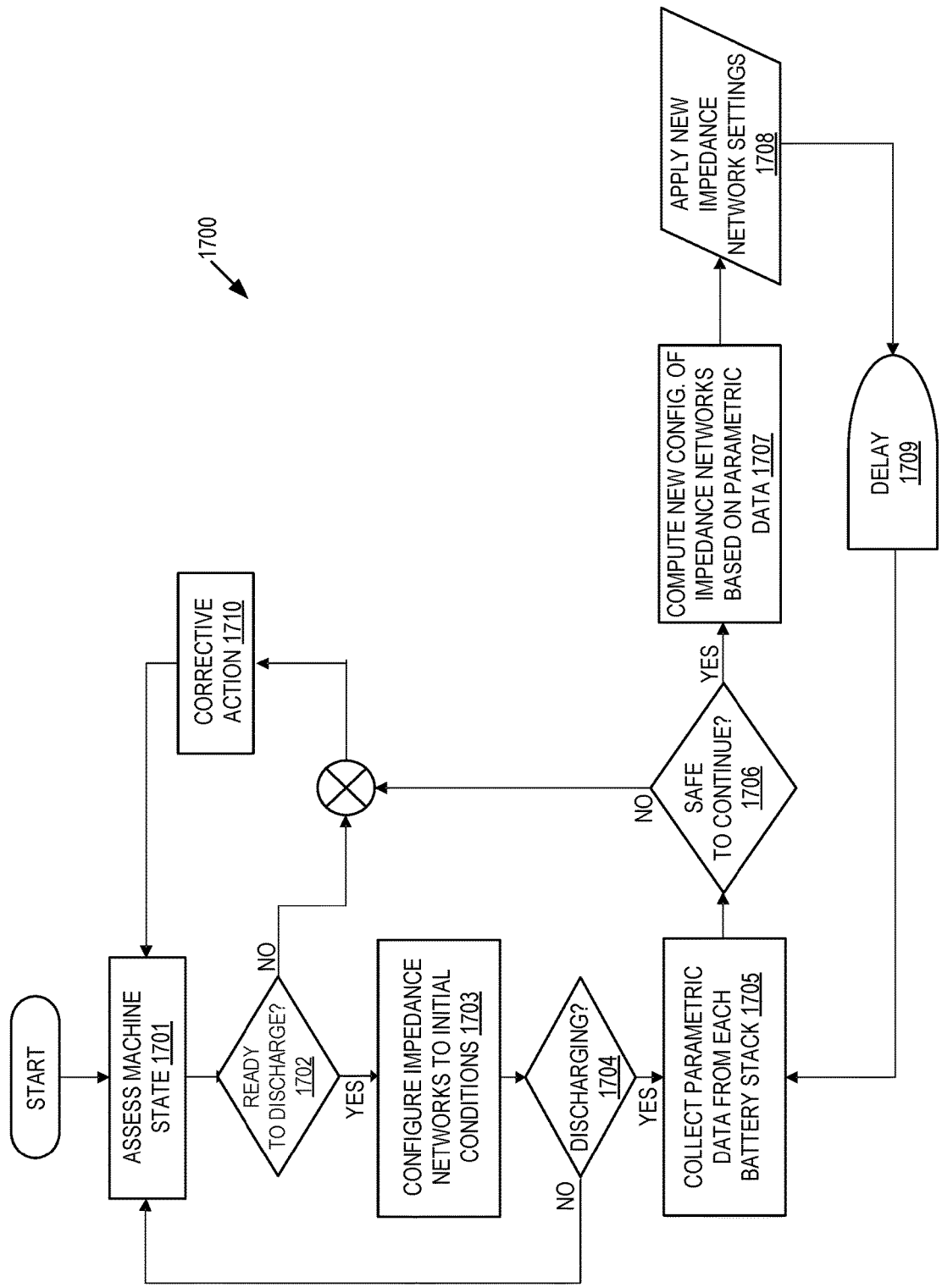
FIG. 17 illustrates a flow chart diagram configured in accordance with embodiments of the present disclosure.

FIG. 17 illustrates a flowchart diagram of a process 1700 that includes exemplary control algorithms performed within the control system 1404 of the energy delivery system 1400 in accordance with embodiments of the present disclosure. As will be further described, the process 1700 may also be performed within the control system 1804 of the system 1800 described with respect to FIGS. 18, 19, and 22.

The energy delivery system 1400 may be initialized (Start). In the process block 1701 (Assess Machine State), the state of the energy delivery system 1400 may be determined. For example, voltages (e.g., of the cells within the battery stacks 1401a, 1401b via the AFEs 1403a, 1403b), currents (e.g., as sensed by the sense resistors 1405a, 1405b), temperatures (e.g., of the cells within the battery stacks 1401a, 1401b via the AFEs 1403a, 1403b) may be measured and this data collected by the control system 1404. Using this data, a determination may be made in the process block 1702 as to whether the energy delivery system 1400 is ready to discharge. If not, some corrective action may be taken in the process block 1710.

For example, if it is determined by the collected data that one or both of the cell stacks 1401a, 1401b is not fully charged, then a charging current may be applied from an external energy source (e.g., see the chargers 603, 703 in FIGS. 9 and 11, respectively). If it is determined by the collected data that one or more cells in one or both of the cell stacks 1401a, 1401b are too hot, a cooling system (not shown) may be activated. If a manual interlock is engaged, the energy delivery system 1400 may be configured to wait for it to be cleared. After a corrective action has been initiated, the process 1700 may return to the process block 1701, and this loop may be continually performed until the process 1700 within the control system 1404 has determined that the energy delivery system 1400 is ready to discharge energy to a load (not shown).

Once the process 1700 within the control system 1404 has determined that the energy delivery system 1400 is ready to discharge, both variable impedance networks 1402a, 1402b may be set to predetermined initial values. These initial values can be determined from equations performed within the control system 1404 in real time (e.g., see the equations described with respect to FIGS. 15 and 16), be set from a predetermined lookup table of predetermined initial values based on parameters such as SOC, cell stack voltages, temperatures, etc. that were measured in the process block 1701, and/or be set from a predetermined lookup table based on the characteristic V-I curves associated with the cell stacks 1401a, 1401b.

Once the initial values of the variable impedance networks 1402a, 1402b have been set, the process 1700 may wait for a discharge of load current to commence, such as upon coupling of a load circuit to the energy delivery system 1400 (e.g., to the $V_o$ Positive and $V_o$ Negative terminals). This may include the process 1700 looping back to the process block 1701. Once discharge current is detected in the process block 1704, the process block 1705 collects parameters (also referred to as "parametric data") from the battery cell stacks 1401a, 1401b, the variable impedance networks 1402a, 1402b, and/or other parts of the system 1400 (e.g., voltage, current, temperature, SOC, charge/discharge cycles, resistance, impedance, etc. utilizing the AFEs 1403a, 1403b, and the current sensors 1405a. 1405b). In the process block 1706, this data may be analyzed to determine if discharge can be allowed to continue. For example, parameters that can terminate a discharge include cell stack voltage below safe limit, cell stack current above safe limit, cell stack temperature outside safe limits, manual safety interlock engaged, and/or any other fault in the control or measurement system, etc. If it is determined in the process block 1706 that discharge cannot safely continue, then the process 1700 may proceed to the process block 1710 to take an appropriate action.

If it is determined in the process block 1706 that discharge can safely continue, then in the process block 1707, it may be determined if an adjustment of either or both of the variable impedance networks 1402a, 1402b is needed. For example, in accordance with a non-limiting embodiment of the present disclosure, a control algorithm performed in the control system 1404 may be configured to maintain the average current (e.g., as measured over a predetermined period of time by the current sensors 1405a, 1405b) of operation to be equal in both the cell stacks 1401a, 1401b. Consequently, if the most recently collected parametric data indicates that average current in the cell stack 1402a is higher than the average current in the cell stack 1401b, then the control algorithm performed by the control system 1404 may be configured to take one of two potential actions to apply a correction. Either the MCU 1404 could signal switches in the variable impedance network 1402a to increase a value of its total impedance, or the control system 1404 could signal switches in the variable impedance network 1402b to decrease a value of its total impedance. Either choice may be acceptable, but the control system 1404 may be configured to prefer one of these corrective actions over the other depending upon any one or more predetermined factors. For example, the variable impedance network 1402a could already be set near its minimum impedance value, and in this case, the control system 1404 may be configured to decrease the impedance value of the variable impedance network 1402b instead. Since the control system 1404 is configured to know the state of both of the variable impedance networks 1402a, 1402b, the control system 1404 may be configured to select the most appropriate action. Once the corrective action has been determined within the process block 1707, in the process block 1708, the control system 1404 sends one or more control signals to one or both of the variable impedance networks 1402a, 1402b to implement the action (i.e., apply the new impedance settings). Once the new settings are applied, the process 1700 may be configured to implement a delay routine (the process block 1709) to allow one or both of the battery cell stack currents ($i_1$, $i_2$) to stabilize under these new settings. Once this delay has expired, the process 1700 may return to the process block 1705. Note that the foregoing algorithms described with respect to the process block 1707 are exemplary and not limiting upon embodiments of the present disclosure.

Embodiments of the present disclosure are further illustrated by the following examples, which are set forth to illustrate the presently disclosed subject matter and are not to be construed as limiting. The examples describe testing carried out to confirm the ability of embodiments of the present systems to deliver and release one or more materials under various conditions that exemplify various environments in which embodiments of the present systems may be utilized.

Figure 18:
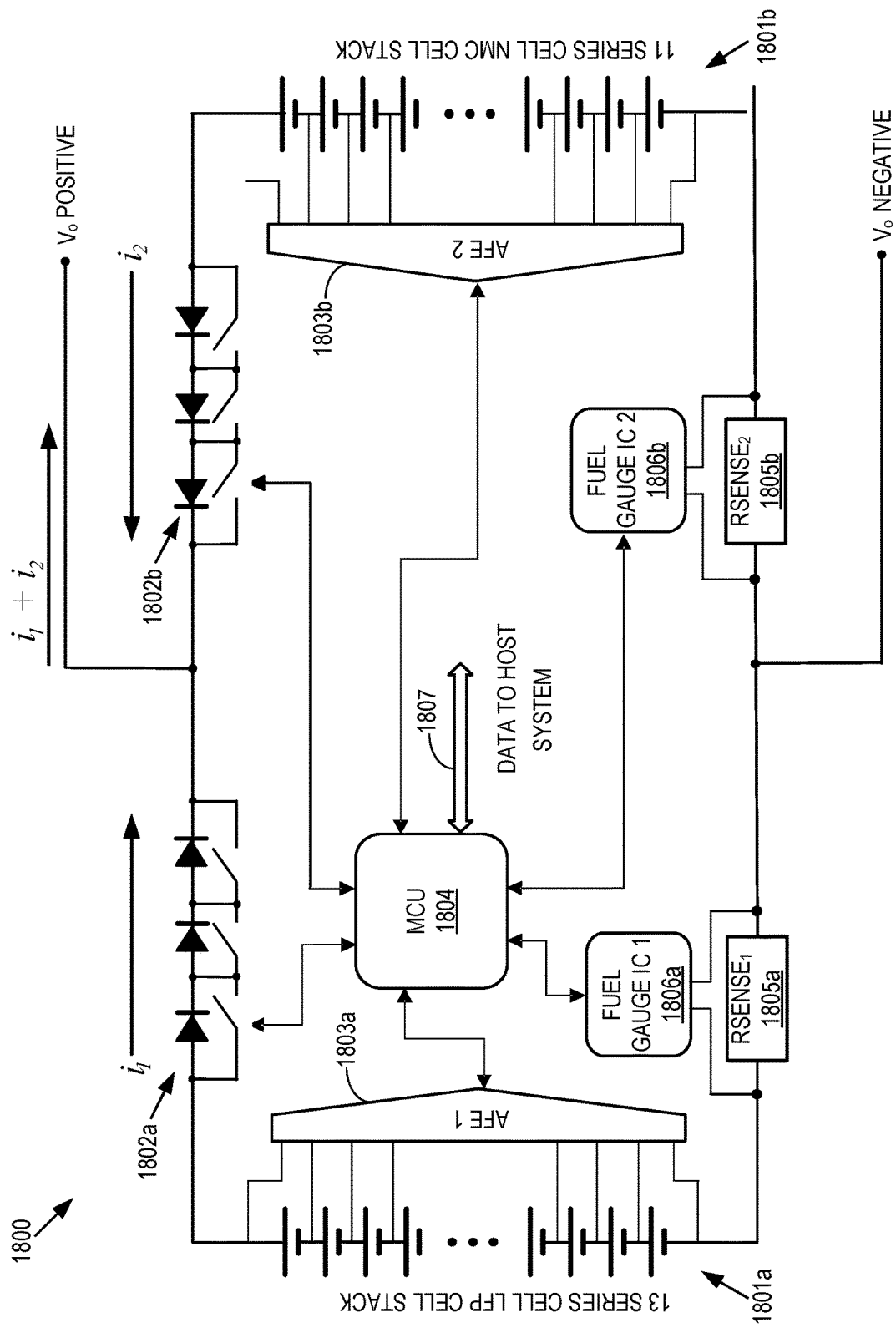
FIG. 18 illustrates a block diagram of an energy delivery system configured in accordance with embodiments of the present disclosure.

Referring to FIG. 18, there is illustrated an energy delivery system 1800 configured in accordance with embodiments of the present disclosure. In the energy delivery system 1800, a first battery cell stack 1801a is coupled in parallel to a second battery cell stack 1801b, where each may be coupled to similar control and monitoring circuits. The battery cell stacks 1801a, 1801b may be coupled to a common control system (e.g., a microcontroller "MCU") 1804 such that parametric information from each battery stack can be collected (e.g., simultaneously) and control algorithms performed to control operations of either or both of the variable impedance networks 1802a, 1802b. The voltage of each cell in the battery stack 1801a may be monitored by an analog front end measurement device ("AFE") 1803a. The AFE 1803a may also collect temperature data, and deliver the collected data to the control system 1304. The battery stack 1801a may be coupled to $V_o$ Negative through a sense resistor (Rsense) 1805a. Each side of the sense resistor 1805a may be coupled to a fuel gauge integrated circuit ("IC") 1806a providing a voltage that represents the value of battery current ($i_1$) to the fuel gauge IC 1806a whenever current is present in the sense resistor 1805a. The fuel gauge IC 1806a may communicate information as to the state of charge ("SOC") of the battery stack 1801a with the control system 1804. The voltage of each cell in the battery stack 1801b may be monitored by an AFE 1803b. The AFE 1803b may also collect temperature data, and deliver the collected data to the control system 1304. The battery stack 1801b may be coupled to $V_o$ Negative through a sense resistor (Rsense) 1805b. Each side of the sense resistor 1805b may be coupled to a fuel gauge IC 1806b providing a voltage that represents the value of battery current ($i_2$) to the fuel gauge IC 1806b whenever current is present in the sense resistor 1805b. The fuel gauge IC 1806b may communicate information as to the SOC of the battery stack 1801b with the control system 1804. The control system 1804 may be configured to communicate data and/or information to an outside host system (e.g., via a communication link or bus 1807). Internal communications between the various components and/or externally from the control system 1804 may be wired or wireless. Communication protocols that may be utilized include, but are not limited to, SMB, I2C, RS232, TTL, Serial, USB, CAN, Network, etc.

Each variable impedance network 1802*a*, 1802*b* contains a number of diodes with bypassing switches such as described with respect to FIG. 16. Although the number of diodes and corresponding switches is illustrated as being the same in each variable impedance network 1802*a*, 1802*b*, the actual number may be the same or different between the two. The number of diodes present in each variable impedance network 1802*a*, 1802*b* defines the maximum voltage drop from the high side of each battery cell stack 1801*a*, 1801*b* to the output terminal V$_o$ Positive, which is the sum of the forward voltage (Vf) drops of all the diodes. In accordance with certain embodiments of the present disclosure, one or more of the diodes may have different parametric characteristics such that a different forward voltage drop is achieved through each diode. The number of diodes active and the number of diodes bypassed in each variable impedance network 1802*a*, 1802*b* may be controlled by the control system 1804 to produce a predetermined magnitude of the downward shift in the characteristic curves of each battery stack 1801*a*, 1801*b* and thus affect the load current contribution of each battery stack 1801*a*, 1801*b* in the energy delivery system 1800.

FIG. 18 depicts the energy delivery system 1800 with the switches open in both of the variable impedance networks 1802*a*, 1802*b* such that the full forward voltage drops of all of the diodes in each variable impedance network 1802*a*, 1802*b* is realized between each battery stack 1801*a*, 1801*b* and the output terminal V$_o$ Positive. While FIG. 18 discloses a dual battery stack energy delivery system, embodiments of the present disclosure may be configured with more than two battery stacks coupled in various series and/or parallel combinations and monitored and controlled by the control system 1804.

Figure 20:
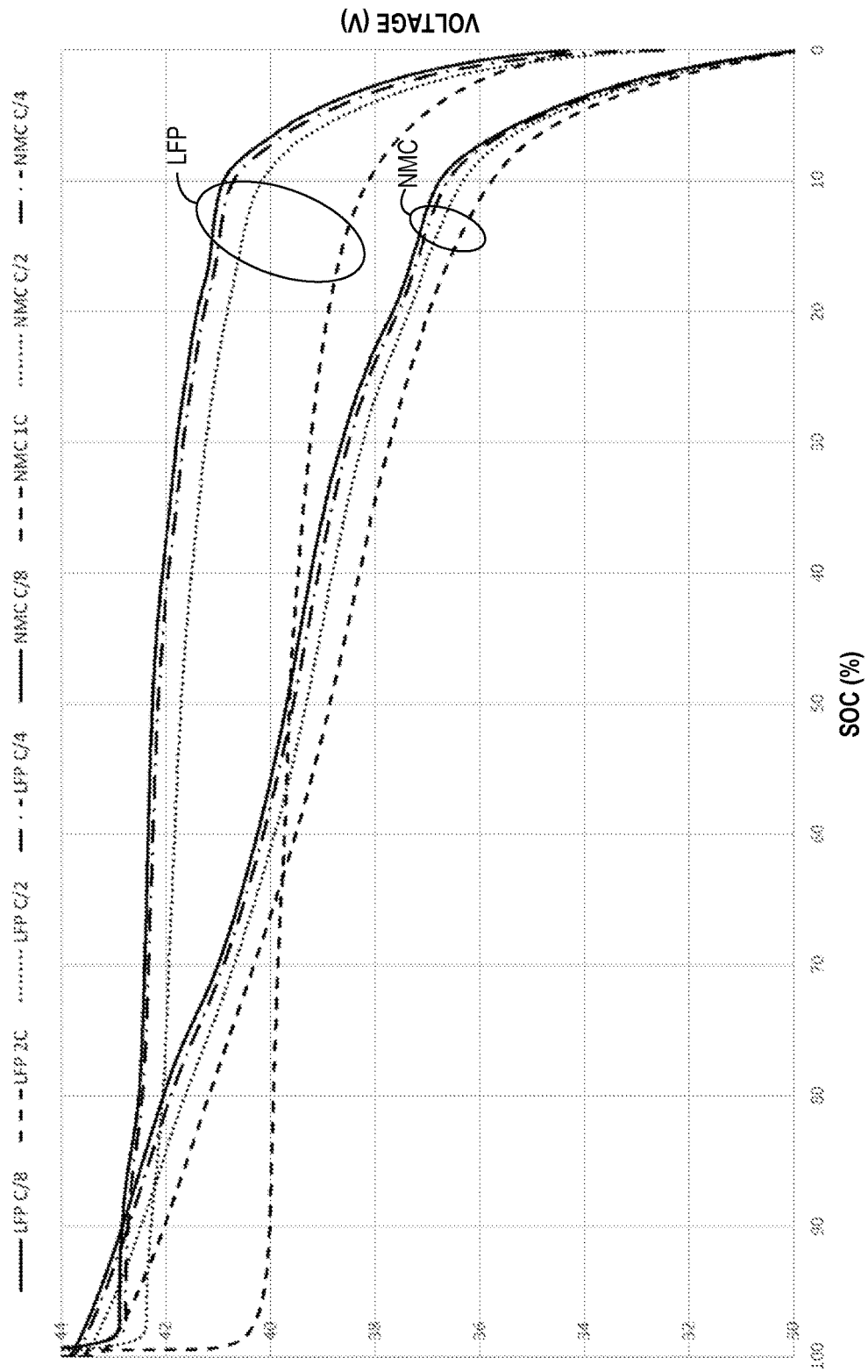
FIG. 20 illustrates a graph of a family of characteristic voltage versus state of charge curves during exemplary discharges of two battery cell stacks having different chemical compositions.

In accordance with the exemplary embodiment of the energy delivery system 1800, the battery stack 1801*a* contains battery cells configured with a relatively high cycle life battery chemistry (e.g., LFP or LTO) such that its terminal voltage and characteristic V-I curves overlap those of the battery stack 1801*b*, which contains NMC battery cells, such as illustrated with the exemplary characteristic V-I curves in FIG. 20. The LFP stack 1801*a* contains 13 cells, with a typical full charge voltage between 44 V-46.8 V (3.6 V/cell). The NMC battery stack 1801*b* contains 11 cells, with a typical full charge voltage between 43.3 V-46.2 V (4.0 V/cell). Both the LFP and NMC battery stacks could be charged to the same voltage at full charge, or alternatively, the maximum charge voltage could be regulated such that voltage of one of the battery stacks may be maintained higher than the voltage of the other battery stack. In this embodiment, the LFP battery stack 1801*a* and the NMC battery stack 1801*b* are configured to have similar chemical capacities in Amp-hours.

Figure 19:
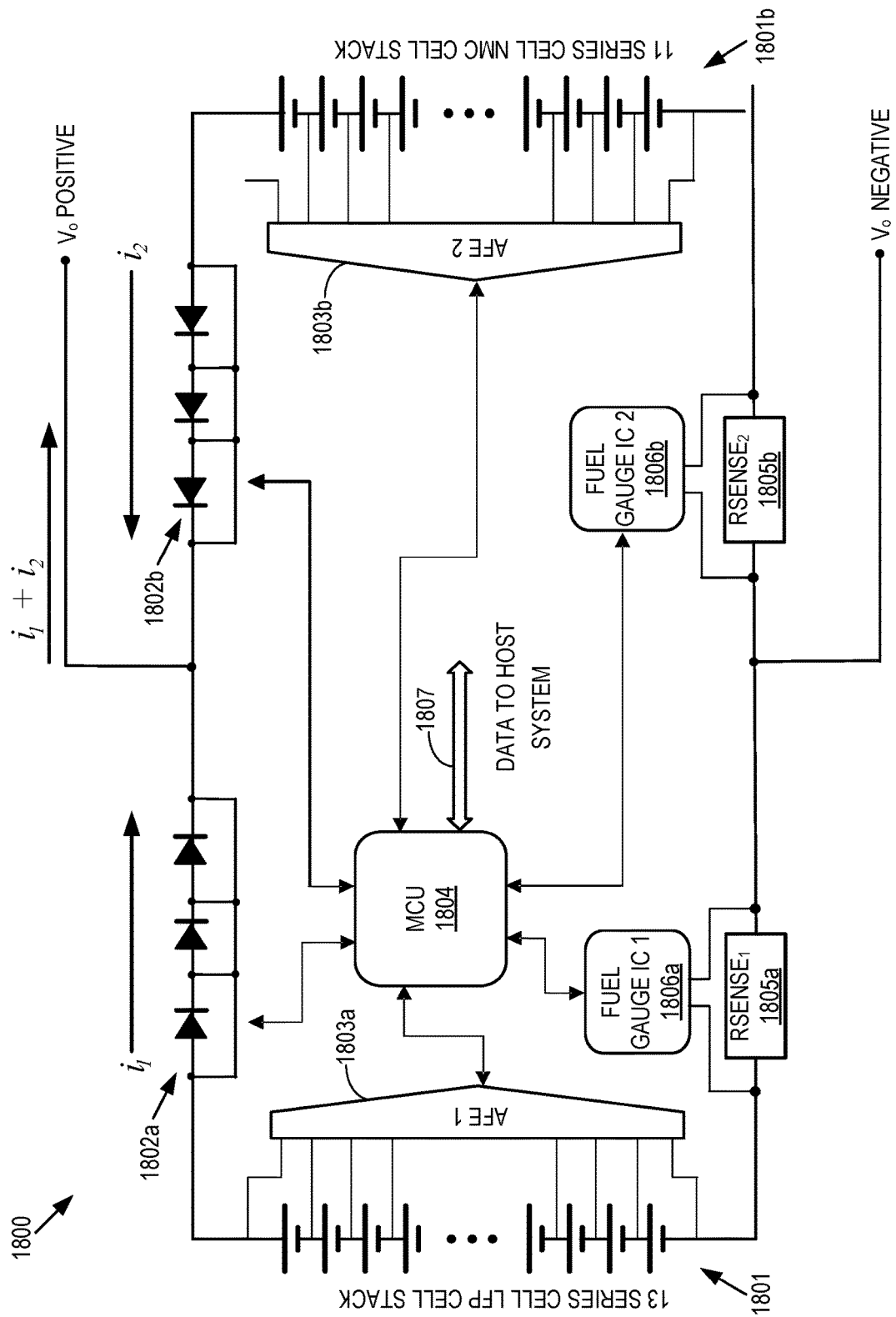
FIG. 19 illustrates a block diagram of an energy delivery system configured in accordance with embodiments of the present disclosure.

Referring to FIG. 19, in a default operating mode, the system 1800 may be configured so that all of the diode switches within both of the variable impedance networks 1802*a*, 1802*b* are closed, bypassing the diodes such that the characteristic V-I curves of each battery stack 1801*a*, 1801*b* are presented at the V$_o$ Positive terminal without any influence from the variable impedance networks 1802*a* and 1802*b*. Within load current ranges of interest, the battery stacks 1801*a*, 1801*b* will share the load based upon their stack voltage as defined by their characteristic V-I curves at all points in time during discharge, because under most conditions of state of charge, the two families of characteristic V-I curves exist on top of each other. At any given moment, the currents in each battery stack will be such that the current $i_1$ in the LFP stack 1801*a* and the current $i_2$ in the NMC stack 1801*b* will exist on the respective characteristic V-I curves that correspond to an equal voltage on the battery terminals. The greater the difference in the positions of the characteristic V-I curves, the greater the current disparity will be between the stacks 1801*a*, 1801*b*. Referring to the battery stack voltage(s) as a function of state of charge illustrated in FIG. 20, it can be seen from the example discharge of the LFP battery stack 1801*a* and the NMC battery stack 1801*b* coupled in parallel that at constant load points, the NMC battery stack 1801*b* initially has a higher terminal voltage for the first approximately 10% depth of discharge. During the remainder of the depth of discharge, the LFP battery stack 1801*a* has a higher terminal voltage and would have a proportionally larger share of current during a discharge.

Figure 21:
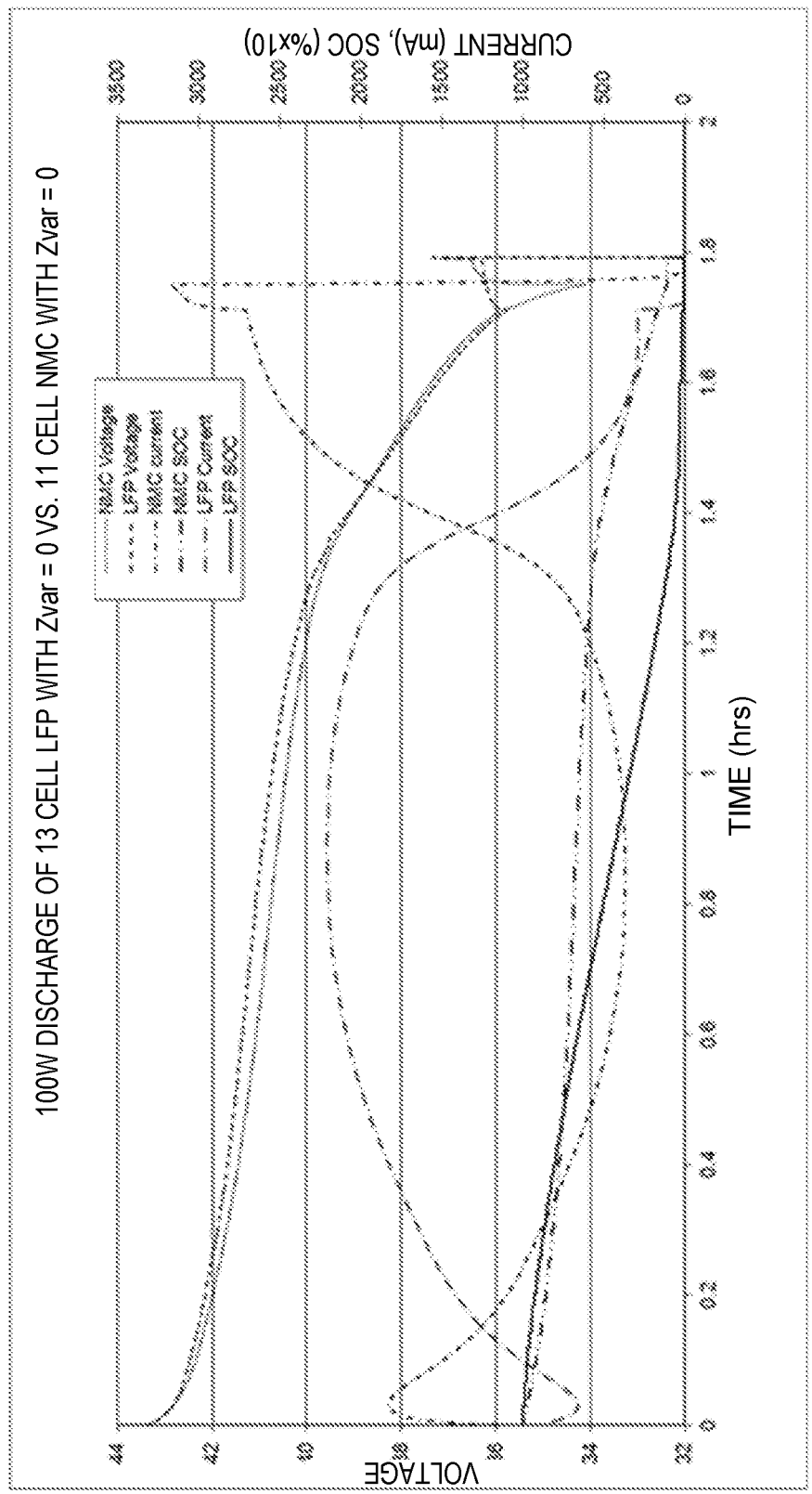
FIG. 21 illustrates plots of discharges of two different battery cell stacks.

FIG. 21 illustrates a graph of an exemplary discharge of the system 1800 as configured in FIG. 19 at 100 W constant power (all of the diode switches within both of the variable impedance networks 1802*a*, 1802*b* are closed so that $Z_{var}=0$ for both such that the battery stack voltages are directly coupled to the output load). Each battery stack 1801*a*, 1801*b* is charged to a starting voltage of 44 V. The discharge duration is approximately 1.8 hours. The battery stacks 1801*a*, 1801*b* are each able to discharge and balance current based on the characteristic V-I curves of each battery stack. Consistent with the voltage curves in FIG. 20, upon coupling of a load to the energy delivery system 1800, FIG. 21 shows that the current $i_1$ rises in the LFP stack 1801*a*, and the voltage quickly drops below the voltage of the NMC stack 1801*b*. This is due to the steep open circuit voltage curve for the LFP chemistry near the full charge state, and a shift in operating point from the light load V-I curve to a higher current V-I curve. The NMC stack 1801*b* soon achieves a slightly higher terminal voltage relative to the LFP stack 1801*a*, and delivers a significant majority of the load current. After approximately 0.18 hours of discharge, the NMC voltage has lowered due to its decreased SOC, and the stack voltage starts to droop into the range of the LFP stack 1801*a*. At this point in the discharge, the LFP stack 1801*a* begins to deliver a higher percentage of current. From this point, the LFP stack 1801*a* maintains a higher voltage and higher current than the NMC stack 1801*b* such that the LFP stack 1801*a* drops in SOC faster than the NMC stack 1801*b* and eventually is depleted. The SOC for the LFP stack 1801*a* slowly moves from 100% to approximately 5% over a period of approximately 1.4 hours. At this point in the discharge event, the LFP stack 1801*a* is nearly depleted of energy such that its terminal voltage drops below that of the NMC battery stack 1801*b*. The NMC battery stack 1801*b* then takes over increasing its current share to nearly 100% for the final few minutes of the discharge.

Figure 22:
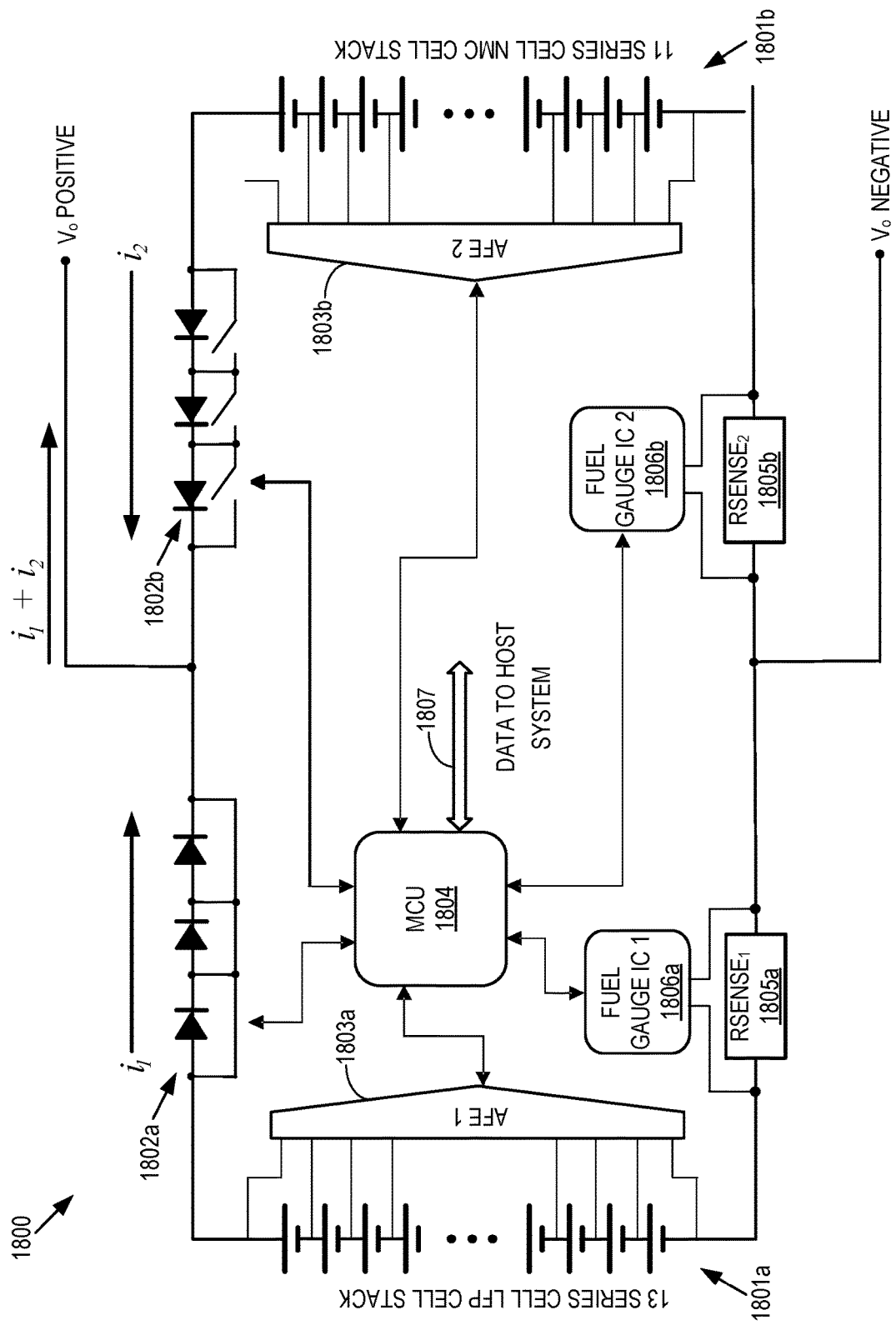
FIG. 22 illustrates a block diagram of an energy delivery system configured in accordance with embodiments of the present disclosure.

FIG. 22 illustrates an exemplary embodiment of an operation of the process blocks 1707-1708 for the system 1800 in which an objective is to configure the system 1800 to bias the energy discharge away from the NMC stack 1801*b* and into the LFP stack 1801*a* such that the LFP current $i_1$ is always higher than the NMC current $i_2$ from the beginning of discharge until the energy in the LFP stack 1801*a* is fully depleted. In this exemplary embodiment, the diode switches in the variable impedance network 1802*a* for the LFP stack 1801*a* are closed, creating a $Z_{var}=0$ for the LFP stack 1801*a*, and the diode switches in the variable impedance network 1802b for the NMC stack 1801b are open, creating a maximum value of $Z_{var}$ ($Z_{var}=3*Vf$). As can be seen in the graph illustrated in FIG. 23, the LFP characteristic V-I curves remain as in the previous example (see FIG. 20), but the NMC characteristic V-I curves have now shifted downward by an amount equal to 3*Vf.

Figure 23:
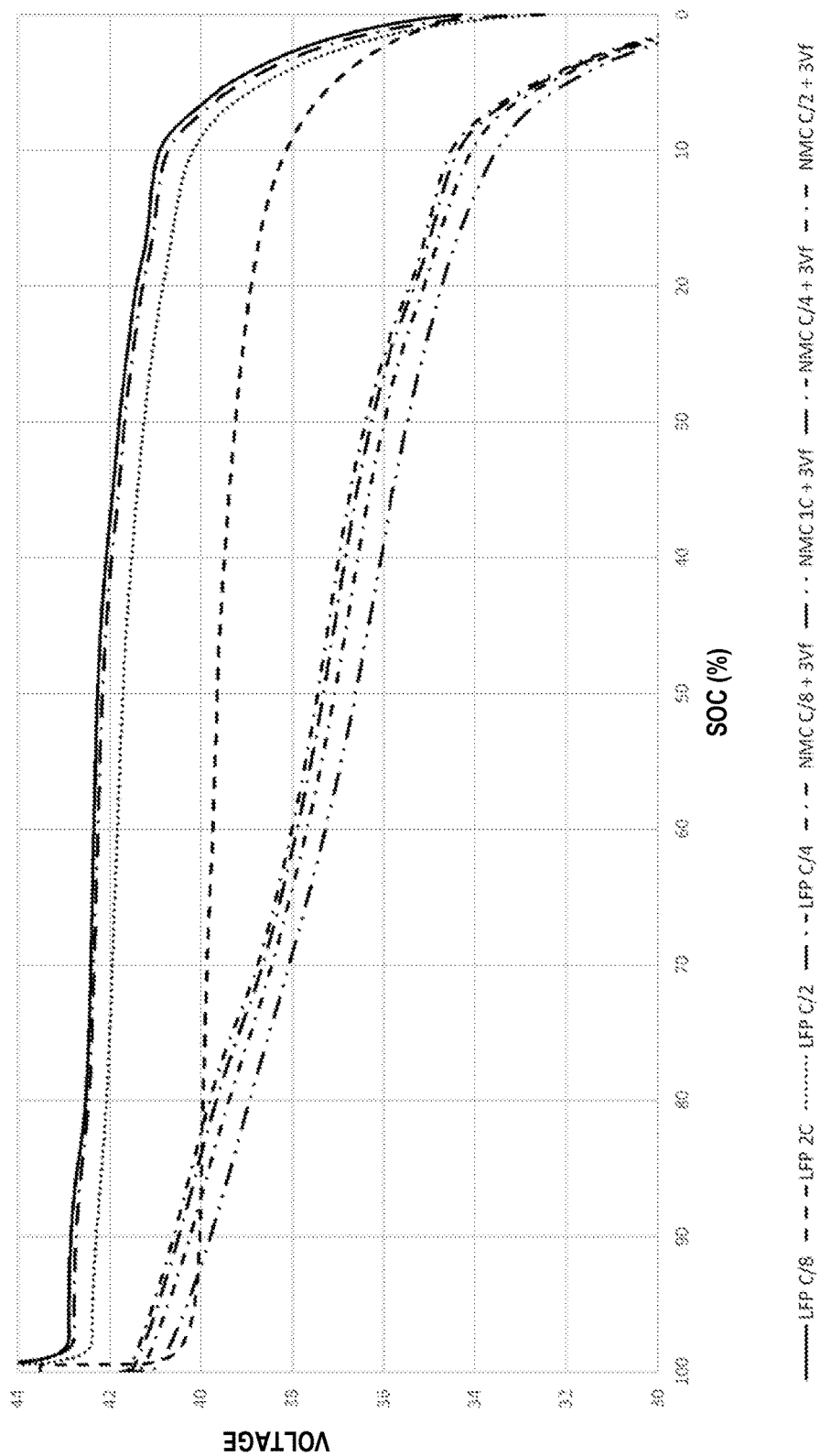
FIG. 23 illustrates a graph of characteristic voltage versus state of charge for two different battery cell stacks having different chemical compositions.

As expected, based on the configuration of the energy delivery system 1800 illustrated in FIG. 22, the voltage curves for the NMC stack 1801b will be offset lower that the LFP stack 1801a due to the $Z_{var}$ contribution. The shifted voltage curves are depicted in FIG. 23. The LFP voltage is greater than the NMC voltage almost across the entire SOC range, and this downward shift in NMC voltage caused by its associated $Z_{var}$ translates to a pronounced bias of current to the LFP stack 1801a during most of the discharge.

Figure 24:
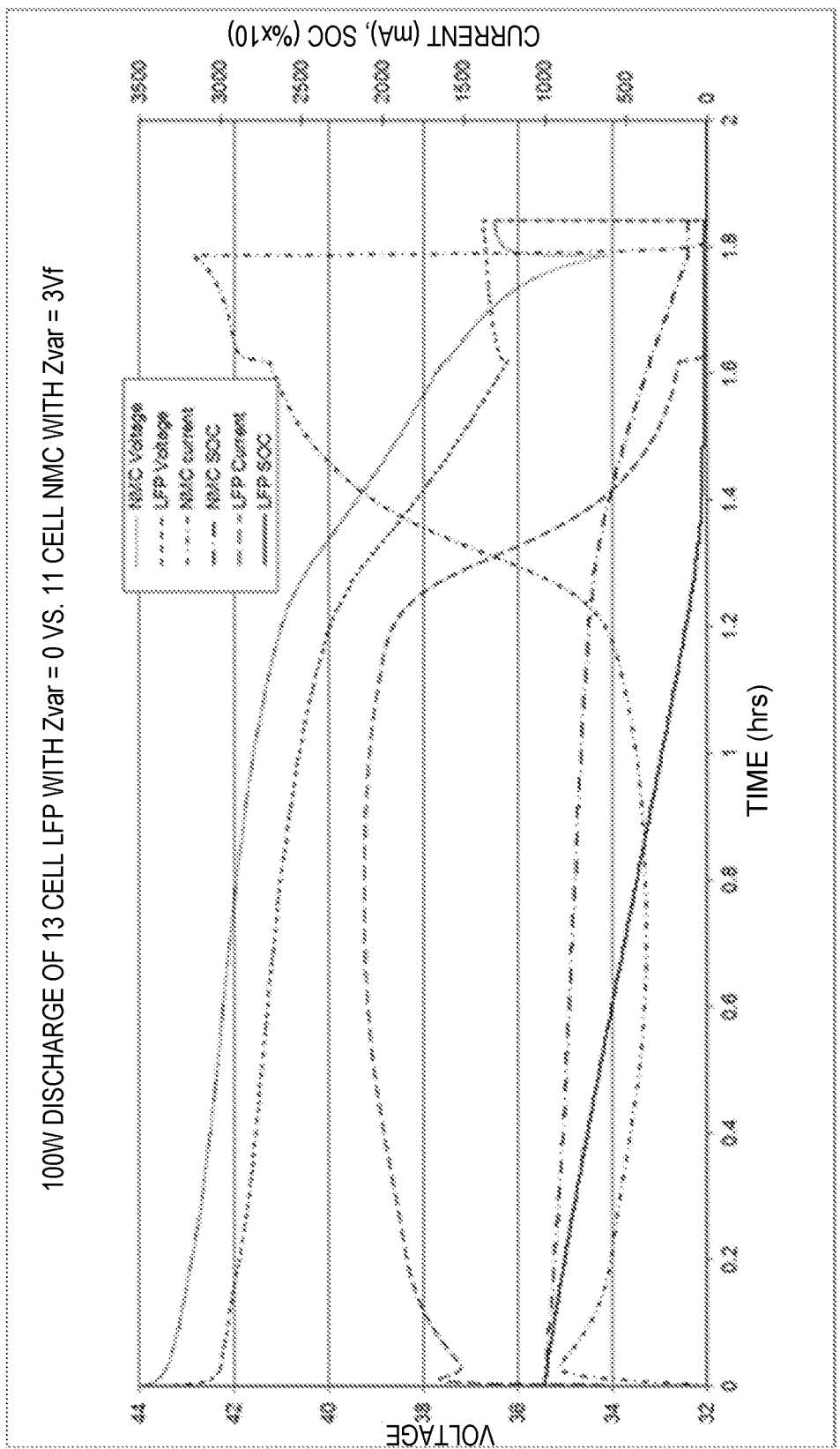
FIG. 24 illustrates plots of discharges of two different battery cell stacks.

FIG. 24 illustrates a graph of an exemplary discharge of the system 1800 as configured in FIG. 22 at 100 W constant power. Each battery stack 1801a, 1801b is charged to a starting voltage of 44 V. The discharge duration is approximately 1.8 hours. In this example, the diode switches in the variable impedance network 1802a are closed such that their $Z_{var}=0$ and the LFP battery stack voltage is directly coupled to the output load $V_o$ Positive, while the diode switches in the variable impedance network 1802b remain open such that the NMC stack voltage is offset downward by 3*Vf. The operating points of each of the battery stacks 1801a, 1801b land on points on their respective characteristic V-I curves such that the output current of the energy delivery system 1800 is biased toward the LFP stack 1801a much more so than in the example in FIGS. 20 and 21. Contrast the discharge illustrated in FIG. 24 for that illustrated in FIG. 21 and it can be seen that the NMC stack 1801b initially delivers approximately 20% of the load current due to the lower position of the NMC characteristic V-I curves. There is no current "inversion" seen where the NMC current ($i_2$) initially rises above the LFP current ($i_1$) until suddenly reversing a short time later as the system operating points transition through the characteristic V-I curves in accordance with the changing SOC of the various battery stacks. The LFP stack 1801a maintains a higher proportion of the total discharge current until such time as the LFP stack 1801a is nearly depleted. The SOC for the LFP stack 1801a slowly transitions from 100% to approximately 5% over a period of approximately 1.4 hours. At this point in the discharge event, the LFP battery stack 1801a is nearly depleted of energy, and at low states of charge such as here the LFP characteristic V-I curves drop below the corresponding NMC characteristic V-I curves at the much higher NMC SOC, and thus the NMC stack 1801b takes over, steadily increasing its proportion of the total output until discharge termination.

By adjusting each variable impedance network 1802a, 1802b such that the positions of the corresponding characteristic V-I curves are also adjusted can shift current sharing between the different battery stacks and bias the discharge current toward one stack or another to meet a specific objective and optimize specific performance characteristics. For example, biasing discharge current towards a battery stack with a relatively higher cycle life and away from a stack with a relatively lower cycle life such that in the event of hundreds of medium duration discharge events, the higher cycle life battery stack would deliver many times the cyclic energy of the other battery stack.

The total depth of discharge for the energy storage system will depend on the load duration. Often battery stacks only complete a partial discharge where 40% to 70% of the total stored energy is delivered. As demonstrated in the example in FIG. 24, in the event of a partial discharge lasting 1.3 hours, the high cycle life LFP battery stack 1801a has discharged 95% (completed 0.95 cycle) of its energy, and the NMC stack 1801b has only discharged about 40% (completed 0.40 cycle) of its energy. If this same discharge were to occur 1000 times, the LFP battery stack 1801a would be considered to have completed 950 cycles compared to the NMC battery stack 1801b completing only 400 cycles.

In accordance with various embodiments of the present disclosure, the energy delivery systems 1400 and 1800 may be similarly configured whereby the control systems, AFEs, fuel gauge ICs, and sense resistors operate in substantially similar manners, except for modifications that may be made to either system depending upon the type of energy storage systems they are coupled to, and the type of configurations utilized within the variable impedance networks.

The digital communication links 1407, 1807 may be configured to send certain data from the control system 1404, 1804 to a host system (not shown). Energy delivery systems such as 1400, 1800 may be embedded into larger systems such as computers, electric bicycles or scooters, electric vehicles, etc. As such, these larger systems are considered as hosts to their embedded energy delivery systems and may have other systems such as motor controls, user or operator interfaces, and similar that may rely on an up to date status of their supporting energy delivery systems for safe operation. In the case of an electric vehicle, such a host system could be a motor control system that can reduce a speed of motors if battery temperature exceeds some threshold or available energy becomes lower than some threshold. The digital communication links 1407, 1807 may be configured to deliver an instantaneous description of the status of the energy delivery system 1400, 1800 upstream to the powered equipment.

In accordance with embodiments of the present disclosure, the fuel gauges disclosed with respect to the energy delivery systems 1400, 1800 may be implemented as an integrated circuit, which may be in a separate package from the MCU 1404, 1804, but its functions can also be integrated into the MCU 1404, 1804. The fuel gauges may be configured to receive battery temperature information and battery cell voltage information either by direct measurement or as a packet of digital data from the AFEs that is relayed to the fuel gauge by the MCU 1404, 1804, and/or may include an analog-to-digital converter configured as a coulomb counter that measures an analog voltage appearing across a current sense resistor and mathematically integrates these measurements either in the digital or analog domains continuously. This voltage developed across the sense resistor is a direct representation of the current flowing into or out of the battery cell stack, where negative voltages represent current flowing out of the battery cell stack (discharge) and positive voltages represent current flowing into the battery cell stack (charge). By mathematically integrating these currents over time, the net change in charge contained in the battery cell stack may be determined, and by summing the net change in battery charge at any given time with a known starting SOC, the present SOC may be determined. The fuel gauge may also be configured to contain digital hardware and programmed instructions to compute not merely total net change in charge and present SOC, but instantaneous current in the sense resistor, average current in the sense resistor over some averaging time period (such as seconds or tens of seconds), total number of charge and discharge cycles (determined by total passed charge in each direction starting from the in-service date of the battery cell stack), and other parameters such as the resistance of the battery cells, for both individual cells and/or a total of all the cells.

In accordance with embodiments of the present disclosure, the battery stacks disclosed with respect to the energy delivery systems 1400 and 1800 may also include an anti-backflow device managed by the common control system. A function of such an anti-backflow device is to prevent the unwanted transfer of energy from one battery stack to another. The operation of such an anti-backflow device is described in PCT/US2017/068301.

In accordance with alternative embodiments of the present disclosure, the variable impedance network(s) may be configured with a number of series connected resistors and associated switches that are then connected in parallel. An energy delivery system configured with such a variable impedance network provides a capability to manipulate the characteristic V-I curves of the separate battery stacks in a similar manner and can achieve similar results in biasing discharge currents between battery stacks or energy storage systems.

In yet another embodiment of the present disclosure, the variable impedance network(s) may be configured with resistors connected in parallel to provide finer resolution in the current-dependent voltage drop than resistors in series. The increased resolution on voltage steps can be used to further regulate the output voltage of the energy delivery system 1400, 1800.

In accordance with alternative embodiments of the present disclosure, one or more of the switchable diodes in any or all of the variable impedance networks may be replaced with a network of parallel switchable resistors. Under such configurations, the control system may utilize the series diodes for a "coarse" adjustment, and the parallel resistors as a "fine" adjustment. Nevertheless, embodiments of the present disclosure may be implemented with one or more of the variable impedance networks containing switchable diodes, switchable resistors, or a combination of both.

Embodiments of the present disclosure described herein may be utilized in uninterruptable power supply ("UPS") systems and Energy Storage Systems that require high energy density to maximize volumetric energy storage. These also require high cycle life, especially at repetitive deep discharge conditions. Energy Storage Systems may be configured to undergo a full charge/discharge cycle once per day. However, the depth of discharge for the system will vary based upon load demand. Low load demand will reduce the required energy delivered by the Energy Storage System, first draining the battery stack designed for high cycle count and not draining the battery stack designed for power density.

Embodiments of the present disclosure described herein may be utilized for vehicle applications where long cycle life, long run times take priority, yet there are periodic demands for transient, high current loads.

As will be appreciated by one skilled in the art, aspects of the present invention (e.g., the control systems 1404, 1804 and the process 1700) may be embodied as a system, method, and/or program product. Accordingly, aspects of the present invention (e.g., the control systems 1404, 1804, the AFEs, the fuel gauges, variable impedance networks) may take the form of an entirely hardware embodiment, an entirely software embodiment (including firmware, resident software, micro-code, etc.), or embodiments combining software and hardware aspects that may all generally be referred to herein as a "circuit," "circuitry," "module," or "system." Furthermore, aspects of the present invention (e.g., the process 1700) may take the form of a program product embodied in one or more computer readable storage medium(s) having computer readable program code embodied thereon. (However, any combination of one or more computer readable medium(s) may be utilized. The computer readable medium may be a computer readable signal medium or a computer readable storage medium.)

It will also be noted that each block of the circuit block diagrams and/or the functionalities represented in the process 1700, and combinations of blocks in the circuit block diagrams and/or the functionalities represented in the process 1700, can be implemented by special purpose hardware-based systems that perform the specified functions or acts, or combinations of special purpose hardware and computer instructions. For example, a module (e.g., the control systems 1404, 1804, the AFEs, the fuel gauges, variable impedance networks) may be implemented as a hardware circuit comprising custom VLSI circuits or gate arrays, off-the-shelf semiconductors such as logic chips, transistors, controllers, or other discrete components. A module (e.g., the control systems 1404, 1804, the AFEs, the fuel gauges, variable impedance networks) may also be implemented in programmable hardware devices such as field programmable gate arrays, programmable array logic, programmable logic devices, or the like.

The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include," "including," "includes," "contain," "containing,", and "contains" mean including, but not limited to.

Various units, circuits, circuitry, or other components (e.g., the control systems 1404, 1804, the AFEs, the fuel gauges, the variable impedance networks) may be described as "configured to" perform a task or tasks. In such contexts, "configured to" is a broad recitation of structure generally meaning "having circuitry that is capable of" performing the task or tasks during operation. As such, the unit/circuit/component can be configured to perform the task even when the unit/circuit/component is not currently on. In general, the circuitry that forms the structure corresponding to "configured to" may include hardware circuits and/or software (including firmware, resident software, micro-code, etc.). Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke a 35 U.S.C. § 112, paragraph six interpretation for that unit/circuit/component.

Unless defined otherwise, all technical and scientific terms used herein have the same meaning as commonly understood to one of ordinary skill in the art to which the presently disclosed subject matter belongs.

As used herein, the terms "about" and "approximately" are used to provide flexibility to a numerical range endpoint by providing that a given value may be "a little above" or "a little below" the endpoint.

In the description herein, a flow-charted technique may be described in a series of sequential actions. The sequence of the actions, and the party performing the actions, may be freely changed without departing from the scope of the teachings. Actions may be added, deleted, or altered in several ways. Similarly, the actions may be re-ordered or looped. Further, although processes, methods, algorithms, or the like may be described in a sequential order, such processes, methods, algorithms, or any combination thereof may be operable to be performed in alternative orders. Further, some actions within a process, method, or algorithm may be performed simultaneously during at least a point in time (e.g., actions performed in parallel), can also be performed in whole, in part, or any combination thereof.

Unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

As used herein, the term "and/or" and the use of the "/" character between two words when used in the context of a listing of entities, refers to the entities being present singly or in combination. Thus, for example, the phrase "A, B, C, and/or D" includes A, B, C, and D individually, but also includes any and all combinations and subcombinations of A, B, C, and D.

Also, the use of "a" or "an" is employed to describe elements and resources described herein. This is done merely for convenience, and to give a general sense of the scope of the invention. This description should be read to include one, or at least one, and the singular also includes the plural, or vice versa, unless it is clear that it is meant otherwise. For example, when a single device is described herein, more than one device may be used in place of a single device. Similarly, where more than one device is described herein, a single device may be substituted for that one device.

To the extent not described herein, many details regarding specific materials, processing acts, and circuits are conventional, and may be found in textbooks and other sources within the computing, electronics, and software arts.

What is claimed is:

1. An energy delivery system, comprising:
    a first energy storage system;
    a second energy storage system;
    a first variable impedance network coupled between the first energy storage system and an output terminal, the first variable impedance network having a first adjustable impedance;
    a second variable impedance network coupled between the second energy storage system and the output terminal, the second variable impedance network having a second adjustable impedance; and
    a control system configured to selectively (1) signal the first variable impedance network to adjust the first adjustable impedance in order to change a level of a first current delivered to the output terminal by the first energy storage system, and (2) signal the second variable impedance network to adjust the second adjustable impedance in order to change a level of a second current delivered to the output terminal by the second energy storage system.

2. The energy delivery system as recited in claim 1, wherein the first variable impedance network comprises a plurality of switchable resistive elements configured to adjust an effective resistance of the first variable impedance network over a predetermined range under control of the control system.

3. The energy delivery system as recited in claim 1, wherein the first variable impedance network comprises a plurality of switchable diodes configured to adjust a number of forward diode voltage drops present in the first variable impedance network over a predetermined range under control of the control system.

4. The energy delivery system as recited in claim 1, wherein the first energy storage system is substantially different from the second energy storage system.

5. The energy delivery system as recited in claim 4, wherein the first energy storage system is configured with a first characteristic V-I curve, and wherein the second energy storage system is configured with a second characteristic V-I curve, and wherein the first characteristic V-I curve is different from the second characteristic V-I curve, and wherein the first characteristic V-I curve crosses over the second characteristic V-I curve at a predetermined state of charge.

6. The energy delivery system as recited in claim 5, wherein the control system is configured to signal at least one of the first and second variable impedance networks in order to adjust where the first characteristic V-I curve crosses over the second characteristic V-I curve.

7. The energy delivery system as recited in claim 5, wherein the control system is configured to signal at least one of the first and second variable impedance networks in order to control a relative percentage of current provided to the output terminal by the first and second energy storage systems.

8. The energy delivery system as recited in claim 4, wherein the first energy storage system comprises a first battery cell stack of a plurality of battery cells each having a first chemical composition, and wherein the second energy storage system comprises a second battery cell stack of a plurality of battery cells each having a second chemical composition, wherein the first chemical composition is different than the second chemical composition, wherein the first battery cell stack is coupled in parallel to the second battery cell stack relative to the output terminal.

9. The energy delivery system as recited in claim 8, wherein the first battery cell stack contains a first number of battery cells, and the second battery cell stack contains a second number of battery cells, wherein the first number is different than the second number.

10. The energy delivery system as recited in claim 8, wherein the control system is configured to selectively signal the first and second variable impedance networks as a function of parametric data collected from the first energy storage system and the second energy storage system, wherein the parametric data comprises voltage and current measurements associated with the delivery of the first current by the first energy storage source and the delivery of the second current by the second energy storage source.

11. The energy delivery system as recited in claim 4, wherein the first energy storage system is selected from a first group consisting of a chemical energy storage system, a kinetic energy storage system, and a potential energy storage system, and wherein the second energy storage system is selected from a second group consisting of a chemical energy storage system, a kinetic energy storage system, and a potential energy storage system.

12. The energy delivery system as recited in claim 1, further comprising:
    a first analog front end configured to measure a first voltage associated with the first energy storage system and communicate the first voltage to the control system;
    a second analog front end configured to measure a second voltage associated with the second energy storage system and communicate the second voltage to the control system;
    a first sense resistor coupled to the first energy storage system;

a first fuel gauge circuit coupled to the first sense resistor, wherein the first fuel gauge circuit is configured to determine first information as a function of the first current sensed by the first sense resistor and communicate the first information to the control system;

a second fuel gauge circuit coupled to the second sense resistor, wherein the second fuel gauge circuit is configured to determine second information as a function of the second current sensed by the second sense resistor and communicate the second information to the control system, wherein the control system is configured to selectively signal the first and second variable impedance networks as a function of the first voltage, the second voltage, the first information, and the second information.

13. A method for delivering energy to a load comprising:
collecting first parametric data that comprises voltage and current information pertaining to a supply of a first current to the load by a first energy storage system;
collecting second parametric data that comprises voltage and current information pertaining to a supply of a second current to the load by a second energy storage system;
adjusting the first current with a first variable impedance network as a function of the collected first and second parametric data, wherein the first variable impedance network is coupled between the first energy storage system and the load;
adjusting the second current with a second variable impedance network as a function of the collected first and second parametric data, wherein the second variable impedance network is coupled between the second energy storage system and the load, wherein the first and second energy storage systems are coupled in parallel relative to the load, wherein the first energy storage system has a different chemical composition or physical construction than the second energy storage system.

14. The method as recited in claim 13, wherein the adjusting of the first current is performed in response to a first control signal received from a control system that collected the first parametric data, and the adjusting of the second current is performed in response to a second control signal received from the control system that also collected the second parametric data.

15. The method as recited in claim 14, wherein the first variable impedance network comprises a plurality of switchable resistive elements configured to adjust an effective resistance of the first variable impedance network in response to the first control signal, and wherein the second variable impedance network comprises a plurality of switchable resistive elements configured to adjust an effective resistance of the second variable impedance network in response to the second control signal.

16. The method as recited in claim 14, wherein the first variable impedance network comprises a plurality of switchable diodes configured to adjust a number of forward diode voltage drops present in the first variable impedance network in response to the first control signal, and wherein the second variable impedance network comprises a plurality of switchable diodes configured to adjust a number of forward diode voltage drops present in the second variable impedance network in response to the second control signal.

17. The method as recited in claim 14, wherein the first energy storage system is configured with a first characteristic V-I curve, and wherein the second energy storage system is configured with a second characteristic V-I curve, and wherein the first characteristic V-I curve is different from the second characteristic V-I curve, and wherein the first characteristic V-I curve crosses over the second characteristic V-I curve at a predetermined state of charge, wherein the control system is configured to signal at least one of the first and second variable impedance networks in order to adjust where the first characteristic V-I curve crosses over the second characteristic V-I curve.

18. The method as recited in claim 14, wherein the first energy storage system comprises a first battery cell stack of a plurality of battery cells each having a first chemical composition, and wherein the second energy storage system comprises a second battery cell stack of a plurality of battery cells each having a second chemical composition, wherein the first chemical composition is different than the second chemical composition.

19. The method as recited in claim 14, wherein the first energy storage system is selected from a first group consisting of a chemical energy storage system, a kinetic energy storage system, and a potential energy storage system, and wherein the second energy storage system is selected from a second group consisting of a chemical energy storage system, a kinetic energy storage system, and a potential energy storage system.

20. The method as recited in claim 14, wherein the control system is configured to signal at least one of the first and second variable impedance networks in order to control a relative percentage of current provided to the output terminal by the first and second currents.

* * * * *